US012725543B2

(12) United States Patent
Chu et al.

(10) Patent No.: US 12,725,543 B2
(45) Date of Patent: Sep. 1, 2026

(54) DISPLAY PANEL, DISPLAY APPARATUS AND CRACK DETECTION METHOD

(71) Applicants: Chengdu BOE Optoelectronics Technology Co., Ltd., Chengdu (CN); BOE Technology Group Co., Ltd., Beijing (CN)

(72) Inventors: Zhiwen Chu, Beijing (CN); Yi Qu, Beijing (CN); Hongwei Ma, Beijing (CN); Yi Zhang, Beijing (CN); Yang Zhou, Beijing (CN); Lu Bai, Beijing (CN); Aoyuan Feng, Beijing (CN)

(73) Assignees: Chengdu BOE Optoelectronics Technology Co., Ltd., Chengu (CN); BOE Technology Group Co., Ltd., Beijing (CN)

( * ) Notice: Subject to any disclaimer, the term of this patent is extended or adjusted under 35 U.S.C. 154(b) by 246 days.

(21) Appl. No.: 18/579,508

(22) PCT Filed: Aug. 31, 2022

(86) PCT No.: PCT/CN2022/116100
§ 371 (c)(1),
(2) Date: Jan. 16, 2024

(87) PCT Pub. No.: WO2024/045018
PCT Pub. Date: Mar. 7, 2024

(65) Prior Publication Data
US 2025/0078699 A1 Mar. 6, 2025

(51) Int. Cl.

| | |
|---|---|
| ***G09G 3/00*** | (2006.01) |
| ***H10K 59/131*** | (2023.01) |
| ***H10K 77/10*** | (2023.01) |
| ***H10K 102/00*** | (2023.01) |

(52) U.S. Cl.
CPC .......... *G09G 3/006* (2013.01); *H10K 59/131* (2023.02); *G09G 3/035* (2020.08);
(Continued)

(58) Field of Classification Search
CPC .......... G09G 3/006; G09G 3/00; G09G 3/035; G09G 2300/0426; G09G 2330/12; H10K 59/131; H10K 77/111; H10K 2102/311
(Continued)

(56) References Cited

U.S. PATENT DOCUMENTS

2018/0158741 A1* 6/2018 Kim .................... H10D 86/481
2018/0342185 A1 11/2018 Lee et al.
(Continued)

FOREIGN PATENT DOCUMENTS

CN 108154800 A 6/2018
CN 108932921 A 12/2018
(Continued)

OTHER PUBLICATIONS

International Search Report for PCT/CN2022/116100 Mailed May 16, 2023.

*Primary Examiner* — Jimmy H Nguyen

(57) ABSTRACT

A display panel includes a substrate, a plurality of display units (Px), at least one first data line, at least one second data line, at least one first detection control unit, at least one second detection control unit, at least one first detection line and at least one second detection line. The first detection line is located at least in a first bezel region, a first end of the first detection line is electrically connected with the first data line through a first detection control unit, and a second end is configured to receive a first detection signal. The second detection line is located at least in a bending region of a second bezel region, a first end of the second detection line is electrically connected to the second data line through a
(Continued)

second detection control unit, and a second end is configured to receive the first detection signal.

19 Claims, 8 Drawing Sheets

(52) U.S. Cl.
CPC . *G09G 2300/0426* (2013.01); *G09G 2330/12* (2013.01); *H10K 77/111* (2023.02); *H10K 2102/311* (2023.02)

(58) Field of Classification Search
USPC ...................................................... 345/55, 76
See application file for complete search history.

(56) References Cited

U.S. PATENT DOCUMENTS

| | | | |
|---|---|---|---|
| 2020/0090566 | A1 | 3/2020 | Lee et al. |
| 2020/0143722 | A1 | 5/2020 | Lee et al. |
| 2020/0379595 | A1 | 12/2020 | Kim |
| 2021/0343606 | A1 | 11/2021 | Kim et al. |
| 2021/0375173 | A1 | 12/2021 | Wang et al. |
| 2022/0399433 | A1 | 12/2022 | Kim et al. |
| 2023/0410704 | A1 | 12/2023 | Bai et al. |

FOREIGN PATENT DOCUMENTS

| | | | |
|---|---|---|---|
| CN | 110910801 | A | 3/2020 |
| CN | 111146247 | A | 5/2020 |
| CN | 111583842 | A | 8/2020 |
| CN | 112018155 | A | 12/2020 |
| CN | 114023771 | A | 2/2022 |
| CN | 114550628 | A | 5/2022 |
| KR | 10-2020-0075410 | A | 6/2020 |
| WO | 2022087844 | A1 | 5/2022 |
| WO | 2022126469 | A1 | 6/2022 |

* cited by examiner

DISPLAY PANEL, DISPLAY APPARATUS AND CRACK DETECTION METHOD

CROSS-REFERENCE TO RELATED APPLICATION

The present application is a U.S. National Phase Entry of International Application No. PCT/CN2022/116100 having an international filing date of Aug. 31, 2022, the entire content of which is hereby incorporated by reference.

TECHNICAL FIELD

The present disclosure relates to, but is not limited to, the field of display technologies, in particular to a display panel, a display apparatus, and a method for detecting a crack.

BACKGROUND

With constant development of display technologies, there are increasing types of display products, e.g. a Liquid Crystal Display (LCD for short), an Organic Light Emitting Diode (OLED for short) display, a Plasma Display Panel (PDP for short), a Field Emission Display (FED for short), etc.

SUMMARY

The following is a summary of subject matters described herein in detail. The summary is not intended to limit the protection scope of claims.

Embodiments of the present disclosure provide a display panel, a display apparatus and a method for detecting a crack.

In one aspect, a display panel is provided in an embodiment of the present disclosure, which includes a substrate, a plurality of display units, at least one first data line, at least one second data line, at least one first detection control unit, at least one second detection control unit, at least one first detection line and at least one second detection line. The substrate includes a display region and a bezel region located around the display region. The bezel region includes a first bezel region surrounding the display region and a second bezel region located on a side of the first bezel region away from the display region. The second bezel region includes at least a bending region. The plurality of display units, the at least one first data line and the at least one second data line are located in the display region, wherein the first data line and the second data line are electrically connected with a part of the plurality of display units, respectively. The first detection line is located at least in the first bezel region, a first end of the first detection line is electrically connected with the first data line through the first detection control unit, and a second end of the first detection line is configured to receive a first detection signal. The second detection line is located at least in the bending region, a first end of the second detection line is electrically connected with the second data line through the second detection control unit, and a second end of the second detection line is configured to receive the first detection signal.

In some exemplary implementations, the plurality of display units electrically connected to the first data line are configured to emit light to display a first bright line when the first detection control unit is turned on and a crack occurs in the first detection line. A plurality of display units electrically connected to the second data line are configured to emit light to display a second bright line when the second detection control unit is turned on and a crack occurs in the second detection line.

In some exemplary implementations, the second end of the first detection line and the second end of the second detection line are electrically connected to a same first signal pin.

In some exemplary implementations, the second bezel region further includes a trace lead-out region and a signal access region located on a side of the bending region away from the display region. In the trace lead-out region, the first detection line and the second detection line are electrically connected through a detection connection line, and the detection connection line is electrically connected with a first signal pin in the signal access region.

In some exemplary implementations, the display panel includes two first detection lines located on two sides of the display region in a second direction and two second detection lines located on two sides of the display region in the second direction. The detection connection lines include a first detection connection line, a second detection connection line and a third detection connection line electrically connected in sequence, wherein the first detection connection line is electrically connected with the first detection line and the second detection line located on one side of the display region, and the third detection connection line is electrically connected with the first detection line and the second detection line located on the other side of the display region. The first detection connection line and the third detection connection line extend in the second direction, the second detection connection line extends in the first direction, and the first direction intersects with the second direction.

In some exemplary implementations, the first detection connection line and the third detection connection line are of a same layer structure, and the second detection connection line is located on a side of the first detection connection line close to the substrate.

In some exemplary implementations, the first detection line includes a first sub-trace located in the first bezel region, and the first sub-trace is a serpentine line. The second detection line includes a fifth sub-trace located in the bending region, and the fifth sub-trace is a serpentine line.

In some exemplary implementations, in the first bezel region, at least a part of the first detection line is located on a side of the second detection line away from the display region.

In some exemplary implementations, the bezel region further includes a first power supply line and a second power supply line; in the bending region, the second power supply line is located on a side of the first detection line and the second detection line away from the first power supply line.

In some exemplary implementations, the display panel further includes at least one third data line located in the display region, at least one third detection line located in the first bezel region, and at least one third detection control unit located in the bezel region; wherein a first end of the third detection line is electrically connected with the third data line through the third detection control unit, and a second end of the third detection line is configured to receive a second detection signal. A plurality of display units electrically connected to the third data line are configured to display a dark line when the third detection control unit is turned on and receives the second detection signal.

In some exemplary implementations, the display panel further includes at least one third data line located in the display region, at least one third detection line located in the first bezel region, and at least one third detection control unit located in the bezel region; wherein a first end of the third detection line is electrically connected with the third data line through the third detection control unit, and a second end of the third detection line is configured to receive the first detection signal. The plurality of display units electrically connected to the third data line are configured to emit light to display a bright line when the third detection control unit is turned on and a crack occurs in the third detection line.

In some exemplary implementations, the first detection control unit includes a first detection transistor, a gate electrode of the first detection transistor is electrically connected with a detection control line, a first electrode of the first detection transistor electrically connected with the first detection line, and a second electrode of the first detection transistor electrically connected with the first data line. The second detection control unit includes a second detection transistor, a gate electrode of the second detection transistor is electrically connected with the detection control line, a first electrode of the second detection transistor electrically connected with the second detection line, and a second electrode of the second detection transistor electrically connected with the second data line.

In some exemplary implementations, the at least one first detection control unit and the at least one second detection control unit are located in the first bezel region.

In another aspect, a display apparatus is provided in an embodiment of the present disclosure, which includes the aforementioned display panel.

On the other hand, a method for detecting a crack is also provided in an embodiment, which is applied to the display panel as described above, and includes: when detecting a crack in a display panel, a first detection line and a first data line are electrically connected through a first detection control unit, a second detection line and a second data line are electrically connected through a second detection control unit, and a first detection signal is provided to the first detection line and the second detection line; whether a crack exists in the first detection line or the second detection line is determined based on light emitting states of a plurality of display units electrically connected to the first data line and the second data line.

After the drawings and the detailed descriptions are read and understood, the other aspects may be comprehended.

BRIEF DESCRIPTION OF DRAWINGS

Accompanying drawings are used for providing further understanding of technical solutions of the present disclosure, constitute a part of the specification, and are used for explaining the technical solutions of the present disclosure together with embodiments of the present disclosure, but do not constitute limitations on the technical solutions of the present disclosure. Shapes and sizes of one or more components in the drawings do not reflect actual scales, but are only intended to schematically describe contents of the present disclosure.

DETAILED DESCRIPTION

Figure 1:
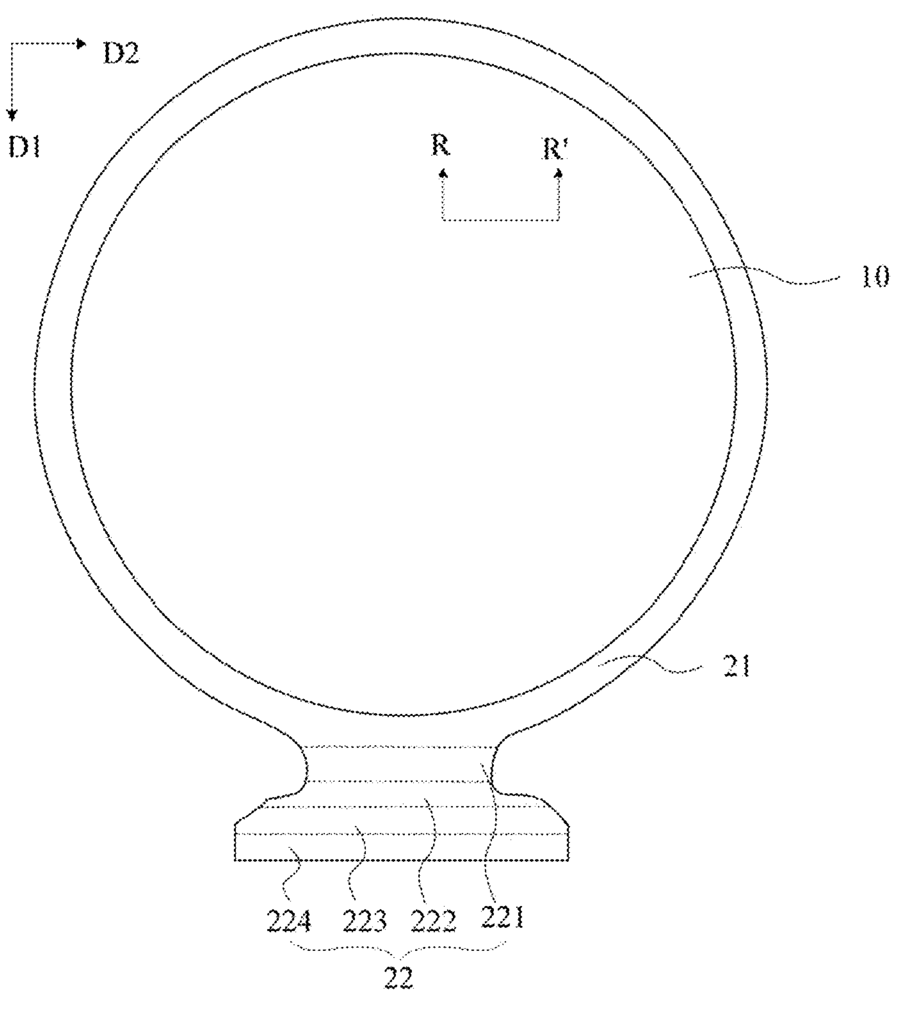
FIG. 1 is a schematic diagram of a display panel according to at least one embodiment of the present disclosure.

Embodiments of the present disclosure will be described below in combination with drawings in detail. Implementations may be practiced in multiple different forms. Those of ordinary skills in the art may easily understand such a fact that implementations and contents may be transformed into other forms without departing from the purpose and scope of the present disclosure. Therefore, the present disclosure should not be explained as being limited to the contents recorded in the following implementations only. The embodiments and features in the embodiments of the present disclosure may be randomly combined with each other in case of no contradictions.

In the drawings, a size of one or more constituent elements, a thickness of a layer, or a region is sometimes exaggerated for clarity. Therefore, one implementation of the present disclosure is not necessarily limited to the size, and a shape and a size of one or more components in the drawings do not reflect an actual scale. In addition, the accompanying drawings schematically illustrate ideal examples, and a mode of the present disclosure is not limited to the shapes, numerical values, or the like shown in the drawings.

Ordinal numerals "first", "second", "third", etc., in the specification are set not to form limits in number but only to avoid the confusion of composition elements. In the present disclosure, "a plurality" represents two or more than two.

In the specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the constituent elements are changed as appropriate according to a direction with which the constituent elements are described. Therefore, appropriate replacements based on situations are allowed, not limited to the expressions in the specification.

In the specification, unless otherwise specified and defined, terms "mounting", "mutual connection", and "connection" should be generally understood. For example, a connection may be a fixed connection, a detachable connection, or an integrated connection; it may be a mechanical connection or a connection; it may be a direct connection, an indirect connection through a middleware, or an internal communication inside between two components. Those of ordinary skills in the art may understand meanings of the above-mentioned terms in the present disclosure according to situations.

In the specification, "electric connection" includes connection of the composition elements through an element with a certain electrical effect. The "element with the certain electrical effect" is not particularly limited as long as electrical signals between the connected constituent elements may be transmitted. Examples of the "element having certain electrical effect" not only include an electrode and a wiring, but also include a switch element such as a transistor, a resistor, an inductor, a capacitor, and other elements with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region through which a current mainly flows.

In the specification, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In a case that transistors with opposite polarities are used, or in a case that a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A triangle, rectangle, trapezoid, pentagon, or hexagon, etc. in this specification is not strictly defined, and it may be an approximate triangle, rectangle, trapezoid, pentagon, or hexagon, etc. There may be some small deformations caused by tolerance, and there may be a chamfer, an arc edge, and a deformation, etc.

In this specification, "about" and "substantially" refer to that a boundary is not defined strictly and a case within a process and measurement error range is allowed. In this specification, "substantially the same" is a case where values differ by less than 10%.

In the present specification, "A extends along a B direction" means that A may include a main portion and a secondary portion connected to the main portion, the main portion is a line, a line segment, or a strip-shaped body, the main portion extends along the B direction, and a length of the main portion extending along the B direction is greater than a length of the secondary portion extending along another direction. In following description, "A extends in a B direction" means "a main body portion of A extends in a B direction".

In the specification, "A and B are of a same layer structure" or "A and B are disposed in a same layer" means that A and B are formed simultaneously through a same patterning process or that distances between surfaces of A and B close to a substrate are substantially the same, or that the surfaces of A and B close to the substrate are in direct contact with a same film layer.

In some implementations, in a manufacturing process of display panels, each process stage has its own process detection function, so as to prevent defective products undetected in this process stage from releasing to a next process stage which results in a waste of materials and material costs. Therefore, the manufacturing process of display panels needs to perform effective and rapid detection at each process stage as much as possible, thereby effectively controlling production costs and improving the yield of the display panel.

A display panel is provided in an embodiment, which includes a substrate, a plurality of display units, at least one first data line, at least one second data line, at least one first detection control unit, at least one second detection control unit, at least one first detection line and at least one second detection line. The substrate includes a display region and a bezel region located around the display region. The bezel region includes a first bezel region surrounding the display region and a second bezel region located on a side of the first bezel region away from the display region. The second bezel region includes at least a bending region. The plurality of display units, the at least one first data line and the at least one second data line are located in the display region, wherein the first data line and the second data line are electrically connected with part of the plurality of display units, respectively. The first detection line is located at least in the first bezel region, a first end of the first detection line is electrically connected with the first data line through the first detection control unit, and a second end of the first detection line is configured to receive a first detection signal. The second detection line is located at least in the bending region, a first end of the second detection line is electrically connected with the second data line through the second detection control unit, and a second end of the second detection line is configured to receive the first detection signal.

The first detection line and the second detection line of the display panel provided in this embodiment can both receive the first detection signal, and the first detection signal can be used to detect cracks in the first detection line and the second detection line synchronously, so as to synchronously detect cracks in the first bezel region and cracks in the bending region to determine qualification of the display panel, thereby achieving rapid and effective crack detection, improving the quality of the display panel and reducing the production cost.

In some exemplary implementations, the plurality of display units electrically connected to the first data line may be configured to emit light to display a first bright line when the first detection control unit is turned on and a crack occurs in the first detection line. The plurality of display units electrically connected to the second data line may be configured to emit light to display a second bright line when the second detection control unit is turned on and a crack occurs in the second detection line. In this example, whether a crack occurs in the first bezel region and the bending region can be determined according to whether the display panel displays the first bright line and the second bright line, and the position where a crack appears can be identified when the display panel displays the first bright line or the second bright line, so as to achieve effective and rapid detection of the first bezel region and the bending region, thereby effectively controlling the production cost and improving the yield of the display panel.

Solutions of the embodiments will be described below through some examples.

FIG. 1 is a schematic diagram of a display panel according to at least one embodiment of the present disclosure. In some examples, as shown in FIG. 1, the display panel may include a display region 10 and a bezel region located around the display region 10. The bezel region may include a first bezel region 21 surrounding the display region 10, and a second bezel region 22 on a side of the display region 10. The first bezel region 22 may be located on a side of the first bezel region 21 away from the display region 10. In a first direction D1, a part of the first bezel region 21 may be located between the display region 10 and the second bezel region 22. The second bezel region 22 may include a bending region 221, a trace lead-out region 222, and a signal access region (including a first signal access region 223 and a second signal access region 224) disposed in sequence in a direction away from the display region 10 (i.e., the first direction D1). The bending region 221 may be located on the side of the first bezel region 21 away from the display region 10, and may be connected with the first bezel region 21. The trace lead-out region 222 is located between the bending region 221 and the first signal access region 223, and the second signal access region 224 is located on a side of the first signal access region 223 away from the display region 10.

In some examples, as shown in FIG. 1, the bending region 221 may be configured to bend the trace lead-out region 222, the first signal access region 223 and the second signal access region 224 to a back of the display region 10. The first signal access region 223 may be configured to provide a corresponding integrated circuit, such as a Display Driver Integration (DDI for short) circuit or a Touch and Display Driver Integration (TDDI for short) circuit. The second signal access region 224 is configured to provide a plurality of bonding pins which may be bonded to a Flexible Printed Circuit (FPC for short) such that a plurality of signal leads (e.g. a drive control line, a power supply line, etc.) are connected with an external control apparatus through the plurality of bonding pins.

In some examples, as shown in FIG. 1, the display region 10 may be circular. However, this embodiment is not limited thereto. For example, the display region 10 may be in another shape, such as a rectangle, an oval and the like.

In some examples, the display region 10 may include a substrate, a display structure layer and an encapsulation structure layer disposed on the substrate. The display structure layer may include a plurality of display units (i.e., sub-pixels), a plurality of gate lines, and a plurality of data lines. The plurality of data lines may extend along the first direction D1, and the plurality of gate lines may extend in a second direction D2. The first direction D1 intersects with the second direction D2. For example, the first direction D1 may be perpendicular to the second direction D2. Orthogonal projections of the plurality of gate lines on the substrate may intersect with orthogonal projections of the plurality of data lines on the substrate, thereby forming a plurality of sub-pixel regions. One sub-pixel is disposed within one sub-pixel region. The plurality of data lines are electrically connected with the plurality of sub-pixels, and are configured to provide data signals to the sub-pixels. The plurality of gate lines are electrically connected with the plurality of sub-pixels, and are configured to provide gate drive signals to the plurality of sub-pixels.

In some examples, a pixel unit in the display region may include three sub-pixels which are a red sub-pixel, a green sub-pixel, and a blue sub-pixel, respectively. The three sub-pixels can be arranged in parallel in a horizontal direction, in parallel in a vertical direction or in a triangle manner. However, this embodiment is not limited thereto. In some other examples, one pixel unit may include four sub-pixels which are a red sub-pixel, a green sub-pixel, a blue sub-pixel, and a white sub-pixel, respectively. The four sub-pixels can be arranged in parallel in a horizontal direction, in parallel in a vertical direction or in a square manner.

In some examples, at least one sub-pixel may include a pixel circuit and a light emitting element. The pixel circuit may be configured to drive a connected light emitting element. For example, the pixel circuit may include a plurality of transistors and at least one capacitor. For example, the pixel circuit may be a circuit of a 3T1C, 4T1C, 5T1C, 5T2C, 6T1C, 7T1C, or 8T1C structure. In above circuit structures, T refers to a thin film transistor, C refers to a capacitor, a number before T represents a quantity of thin film transistors in the circuit, and a number before C represents a quantity of capacitors in the circuit. In some examples, the plurality of transistors in the pixel circuit may be P-type transistors or may be N-type transistors. Same type of transistors in the pixel circuit may simplify a process flow, reduce a process difficulty of the display panel, and improve a yield of a product. In some other examples, the plurality of transistors in the pixel circuit may include P-type transistors and N-type transistors.

In some examples, low temperature polysilicon thin film transistors, or oxide thin film transistors, or low temperature polysilicon thin film transistors and oxide thin film transistors, may be used as the plurality of transistors in the pixel circuit. An active layer of the low temperature poly-crystalline silicon thin film transistor is made of Low Temperature Poly-crystalline Silicon (LTPS for short), and an active layer of an oxide thin film transistor is made of an oxide semiconductor (Oxide). The low temperature poly-crystalline silicon thin film transistor has advantages such as a high migration rate and fast charging, and the oxide thin film transistor has advantages such as a low leakage current. The low temperature poly-crystalline silicon thin film transistor and the oxide thin film transistor being integrated on one display panel, that is, an LTPS+Oxide (LTPO for short) display panel, has advantages of both the low temperature poly-crystalline silicon thin film transistor and the oxide thin film transistor, such that low-frequency drive may be achieved, power consumption may be reduced, and display quality may be improved.

In some examples, the light emitting element may be any one of a Light Emitting Diode (LED for short), an Organic Light emitting Diode (OLED for short), a Quantum Dot Light emitting Diode (QLED for short), a Micro LED (including a mini-LED or a micro-LED) and the like. For example, the light emitting element may be an OLED, and the light emitting element may emit red light, green light, blue light, or white light, etc. when driven by a pixel circuit corresponding to the light emitting element. A color of light emitted from the light emitting element may be determined as needed. In some examples, the light emitting element may include an anode, a cathode, and an organic light emitting layer located between the anode and the cathode. The anode of the light emitting element may be electrically connected with the corresponding pixel circuit. However, this embodiment is not limited thereto.

In some examples, the display panel may be integrated with a touch structure. The display region of the display panel may further include a touch structure layer located on a side of the encapsulation structure layer away from the substrate. The touch structure layer is disposed on the encapsulation structure layer of the display panel to form a structure of Touch on Thin Film Encapsulation (Touch on TFE for short). The touch structure integrating with a display structure has advantages of lightness and thinness, and foldability, and may meet product requirements such as flexible folding and narrow bezels. The Touch on TFE structure mainly includes a Flexible Multi-Layer On Cell (FMLOC for short) structure and a Flexible Single-Layer On Cell (FSLOC for short) structure. The FMLOC structure is based on an operating principle of mutual capacitance detection. Generally, a drive (Tx) electrode and a sensing (Rx) electrode are formed by two layers of metal, and an Integrated Circuit (IC for short) achieves a touch action by detecting mutual capacitance between the drive electrode and the sensing electrode. The FSLOC structure is based on an operating principle of self-capacitance (or voltage) detection. Generally, a touch electrode is formed by a single layer of metal, and an integrated circuit achieves a touch action by detecting the self-capacitance (or voltage) of the touch electrode.

In some examples, the touch structure layer includes a plurality of touch units. At least one touch unit may include at least one touch electrode. An orthographic projection of the at least one touch electrode on the substrate may include orthographic projections of a plurality of sub-pixels on the substrate. When the touch unit includes a plurality of touch electrodes, the plurality of touch electrodes may be disposed at intervals, and adjacent touch electrodes may be connected with each other through a connecting portion. A touch electrode and the connecting portion may be of a same layer structure. In some examples, the touch electrode may be in a shape of rhombus, such as a regular rhombus, a horizontally long rhombus, or a longitudinally long rhombus. However, this embodiment is not limited thereto. In some examples, the touch electrodes may be in any one or more shapes of a triangle, a square, a trapezoid, a parallelogram, a pentagon, a hexagon, and another polygon.

In some examples, touch electrodes in the display panel may be in a form of a metal mesh. The metal mesh is formed by interweaving a plurality of metal wires, and includes a plurality of mesh patterns. A mesh pattern is a polygon enclosed by a plurality of metal wires. The touch electrodes in the form of the metal mesh have advantages of low resistance, small thickness, a quick response speed, etc. However, this embodiment is not limited thereto.

Figure 2:
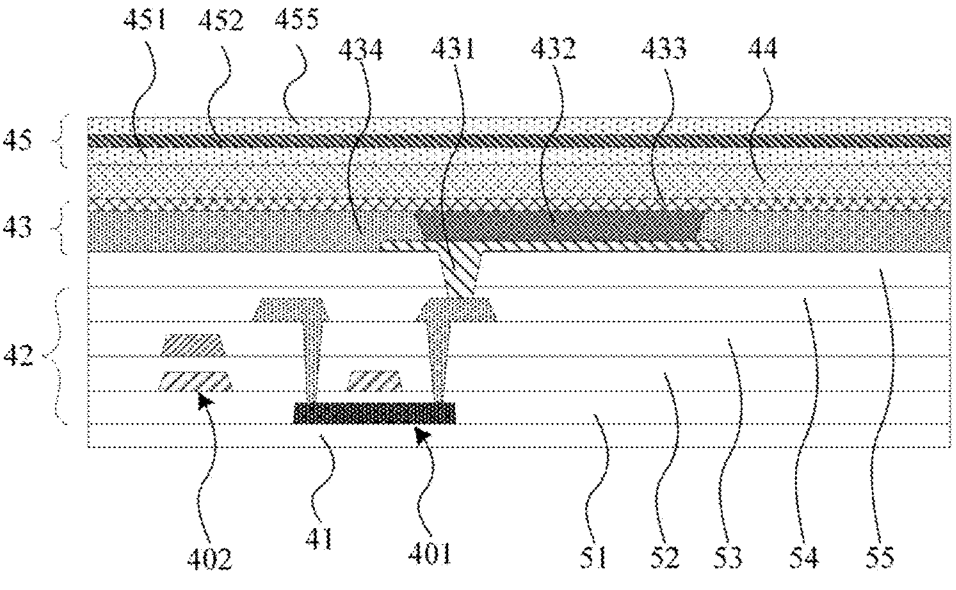
FIG. 2 is a schematic partial sectional view along an R-R direction in FIG. 1.

FIG. 2 is a partial cross-sectional view along an R-R' direction in FIG. 1. In some examples, as shown in FIGS. 1 and 2, in a direction perpendicular to the display panel, the display region 10 includes a substrate 41, and a drive circuit layer 42, a light emitting element 43, an encapsulation structure layer 44, and a touch structure layer 45 which are disposed in sequence on the substrate 41. In FIG. 2, only a structure of one sub-pixel is taken as an example for illustration.

In some examples, the substrate 41 may be a flexible substrate. The flexible substrate may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET), or a polymer soft film for which a surface treatment has been performed, etc. Materials of the first inorganic material layer and the second inorganic material layer may be silicon nitride (SiNx), or silicon oxide (SiOx), etc., for improving water-resistance and oxygen-resistance capabilities of a base substrate. A material of the semiconductor layer may be amorphous silicon (a-si). However, this embodiment is not limited thereto.

In some examples, as shown in FIG. 2, the drive circuit layer 42 may include a plurality of transistors and at least one storage capacitor which form a pixel circuit. In FIG. 2, a first transistor 401 and a first storage capacitor 402 are taken as an example for illustration. The drive circuit layer 42 in the display region 10 may include a semiconductor layer disposed on the substrate 41, a first insulation layer 51 covering the semiconductor layer, a first gate metal layer disposed on the first insulation layer 51, a second insulation layer 52 covering the first gate metal layer, a second gate metal layer disposed on the second insulation layer 52, a third insulation layer 53 covering the second gate metal layer, and a first source-drain metal layer disposed on the third insulation layer 53. The semiconductor layer may at least include a first active layer. The first gate metal layer may at least include a first gate electrode and a first capacitor electrode. The second gate metal layer may at least include a second capacitor electrode. The first source-drain metal layer may at least include a first source electrode and a first drain electrode. The first active layer, the first gate electrode, the first source electrode, and the first drain electrode may form a first transistor 401. The first capacitor electrode and the second capacitor electrode may form a first storage capacitor 402. In some other examples, the drive circuit layer may further include a sixth insulation layer and a second source-drain metal layer which are located on a side of the first source-drain metal layer away from the substrate. However, this embodiment is not limited thereto.

In some examples, as shown in FIG. 2, the light emitting element 43 may include a first electrode 431, a pixel definition layer 434, an organic light emitting layer 432, and a second electrode 433. The first electrode 431 is disposed on a fifth insulation layer 55, and is connected with the first drain electrode of the first transistor 401 through a via provided on a fourth insulation layer 54 and the fifth insulation layer 55. The pixel definition layer 434 may be disposed on the first electrode 431 and the fifth insulation layer 55, and may be provided with a pixel opening thereon, wherein the pixel opening may expose a portion of a surface of the first electrode 431. The organic light emitting layer 432 is at least partially disposed in the pixel opening, and the organic light emitting layer 432 is connected with the first electrode 431. The second electrode 433 is disposed on the organic light emitting layer 432, and the second electrode 433 is connected with the organic light emitting layer 432.

In some examples, as shown in FIG. 2, the organic light emitting layer 432 of the light emitting element 43 may include an Emitting Layer (EML for short), and include one or more film layers of a Hole Injection Layer (HIL for short), a Hole Transport Layer (HTL for short), a Hole Block Layer (HBL for short), an Electron Block Layer (EBL for short), an Electron Injection Layer (EIL for short), and an Electron Transport Layer (ETL for short). When driven by voltages of the first electrode 431 and the second electrode 433, light is emitted according to a required gray scale, in virtue of light emitting characteristics of an organic material. In some examples, light emitting layers of light emitting elements in different colors are different. For example, a red light emitting element includes a red light emitting layer, a green light emitting element includes a green light emitting layer, and a blue light emitting element includes a blue light emitting layer. In order to reduce a process difficulty and improve a yield, a hole injection layer and a hole transport layer located on a side of a light emitting layer may be a common layer, and an electron injection layer and an electron transport layer located on another side of the light emitting layer may be a common layer. In some examples, any one or more layers of the hole injection layer, the hole transport layer, the electron injection layer, and the electron transport layer may be made in one process (one evaporation process or one inkjet printing process), and isolation may be achieved by means of a formed film layer surface segment difference or by means of a surface treatment. For example, any one or more of hole injection layers, hole transport layers, electron injection layers, and electron transport layers corresponding to adjacent sub-pixels may be isolated. In some examples, the organic light emitting layer may be manufactured and formed through evaporation using a Fine Metal Mask (FMM for short) or an open mask, or manufactured and formed using an inkjet process.

In some examples, as shown in FIG. 2, the encapsulation structure layer 44 may include a first encapsulation layer, a second encapsulation layer, and a third encapsulation layer which are stacked. The first encapsulation layer and the third encapsulation layer may be made of an inorganic material. The second encapsulation layer may be made of an organic material. The second encapsulation layer is disposed between the first encapsulation layer and the third encapsulation layer so as to ensure that external moisture cannot enter the light emitting element 43. However, this embodiment is not limited thereto. For example, an encapsulation layer may be of a five-layer stacked structure of inorganic/organic/inorganic/organic/inorganic.

In some examples, as shown in FIG. 2, the touch structure layer 45 may include a first touch insulation layer 451 disposed on a side of the encapsulation layer 44 away from the substrate 41, a touch electrode layer 452 disposed on a side of the first touch insulation layer 451 away from the substrate 41, and a touch protective layer 455 disposed on a side of the touch electrode layer 452 away from the substrate 41. The touch structure layer in this example is illustrated by taking an FSLOC structure as an example. However, this embodiment is not limited thereto.

Figure 3:
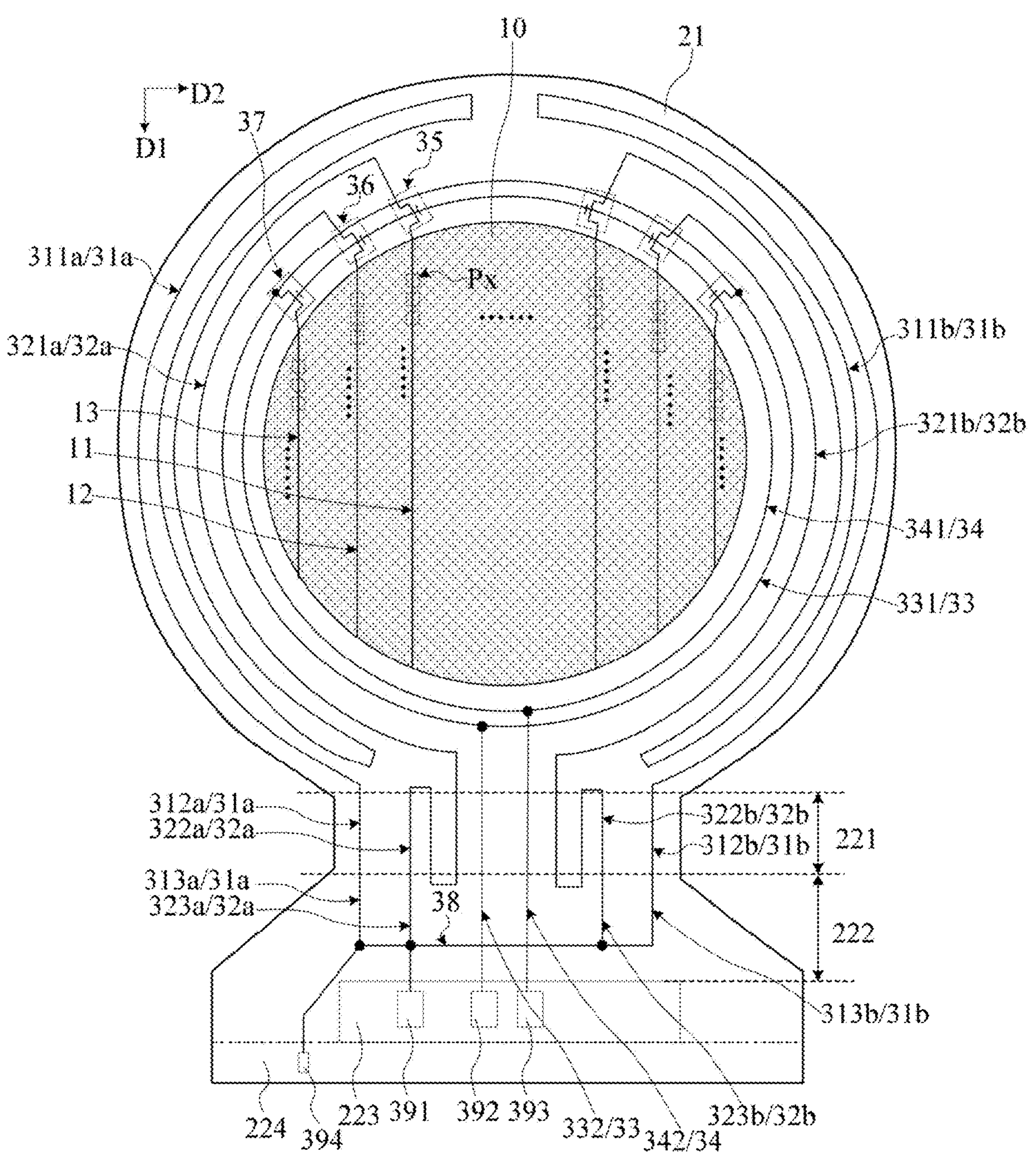
FIG. 3 is a partially schematic diagram of a trace in a bezel region of a display panel according to at least one embodiment of the present disclosure.

FIG. 3 is a partially schematic diagram of a trace of a display panel according to at least one embodiment of the present disclosure. In FIG. 3, several data lines in the display region and several detection lines in the bezel region are taken as an example for illustration, and other traces are omitted.

In some examples, as shown in FIG. 3, the display region 10 may include at least two first data lines 11, at least two second data lines 12, and a plurality of third data lines 13. Each data line may be electrically connected with a plurality of display units Px arranged in the first direction D1, and is configured to supply data signals to the plurality of display units Px. For example, the first data lines 11 and the second data lines 12 may be configured to be electrically connected with display units that emit light of a same color. For example, the first data lines 11 and the second data lines may be configured to be electrically connected with a plurality of display units that emit green light. However, this embodiment is not limited thereto.

In some examples, two first data lines 11 may be substantially symmetrical with respect to a centerline of the display region 10 along the second direction D2, and two second data lines 12 may be substantially symmetrical with respect to the centerline of the display region 10 along the second direction D2. The first data line 11 and the second data line 12 may not be adjacent, and a plurality of third data lines 13 may be provided between the first data line 11 and the second data line 12. A quantity of third data lines 13 provided between the first data line 11 and the second data line 12 is required such that a plurality of display units electrically connected to the first data line 11 and a plurality of display units electrically connected to the second data line 12 can be distinguished by naked eyes when lit. The two first data lines 11 may not be adjacent and a plurality of third data lines 13 may be provided between the two first data lines 11. A quantity of third data lines 13 provided between the two first data lines 11 is required such that a plurality of display units electrically connected to the two first data lines 11 can be distinguished by the naked eye when lit. The two second data lines 12 may not be adjacent and a plurality of third data lines 13 may be provided between the two second data lines 12. A quantity of third data lines 13 provided between the two second data lines 12 is required such that a plurality of display units electrically connected to the two second data lines 12 can be distinguished by naked eyes when lit. For example, the data lines in the display region 10 other than the first data lines 11 and the second data lines 12 may all serve as the third data lines 13. However, this embodiment is not limited thereto.

In some examples, as shown in FIG. 3, the bezel region may include a plurality of detection control units (e.g. a first detection control unit 35, a second detection control unit 36, and a third detection control unit 37), two first detection lines 31*a* and 31*b*, two second detection lines 32*a* and 32*b*, one third detection line 33, and one detection control line 34. For example, a plurality of detection control units may be located in the first bezel region 21. One first detection control unit 35 may be electrically connected to one first detection line and at least one first data line 11, one second detection control unit 36 may be electrically connected to one second detection line and at least one second data line 12, and one third detection control unit 37 may be electrically connected to one third detection line 33 and at least one third data line 13. One third detection line 33 may be electrically connected to a plurality of third detection control units 37 and a plurality of third data lines 13. The detection control line 34 may be electrically connected to the first detection control unit 35, the second detection control unit 36 and the third detection control unit 37. However, this embodiment is not limited thereto. In other examples, a plurality of detection control units may be located in the second bezel region.

In some examples, as shown in FIG. 3, the two first detection lines 31*a* and 31*b* may be substantially symmetrical with respect to the centerline of the display panel along the second direction D2. For example, the first detection line 31*a* may be located in a left half region of the bezel region, and the first detection line 31*b* may be located in a right half region of the bezel region. The first detection line 31*a* may include a first sub-trace 311*a* located in the first bezel region 21, a second sub-trace 312*a* located in the bending region 221, and a third sub-trace 313*a* located in the trace lead-out region 222. The first detection line 31*b* may include a first sub-trace 311*b* located in the first bezel region 21, a second sub-trace 312*b* located in the bending region 221, and a third sub-trace 313*b* located in the trace lead-out region 222. The first sub-traces 311*a* and 311*b* may be serpentine traces. The serpentine trace is a bending curve. For example, after one end of the trace extends along one direction for a certain distance, it bends circuitously and extends along a direction opposite to this direction for a certain distance, and bends circuitously again and extends along this direction. In this way, circuitous bending is repeated for several times to form the serpentine trace. In this example, the first sub-traces 311*a* and 311*b* may be wound in a direction in which the first bezel region 21 is away from the display region 10. For example, the first sub-traces 311*a* and 311*b* may include a plurality of arc segments (e.g. three arc segments) and straight line segments connected between adjacent arc segments. A shape of the arc segments may be substantially the same as an edge shape of a left part or a right part of the display region 10. One end of the first sub-trace 311*a* (or 311*b*) may be electrically connected with the first detection control unit 35 and the other end of the first sub-trace 311*a* (or 311*b*) may be electrically connected with one end of the second sub-trace 312*a* (or 312*b*). The other end of the second sub-trace 312*a* (or 312*b*) may be electrically connected with one end of the third sub-trace 313*a* (or 313*b*), and the other end of the third sub-trace 313*a* (or 313*b*) may be electrically connected with a first signal pin 391 located in the first signal access region 223 through a detection connection line 38. The detection connection line 38 may also extend to the second signal access region 224 and be electrically connected to a fourth signal pin 394 located in the second signal access region 224. The fourth signal pin 394 can be used as a test pin. For example, a test signal provided by the fourth signal pin 394 may identify a defect in an integrated circuit disposed in the first signal access region.

In some examples, as shown in FIG. 3, the first detection control unit 35 may be located on a side of the first detection line 31*a* or 31*b* close to the display region 10. The first detection control unit 35 may include a first detection transistor. A gate electrode of the first detection transistor may be electrically connected with the detection control line 34, a first electrode of the first detection transistor may be electrically connected with a first end of the first detection line 31*a* or 31*b*, and a second electrode of the first detection transistor may be electrically connected with the first data line 11 in the display region 10.

In some examples, as shown in FIG. 3, the two second detection lines 32*a* and 32*b* may be substantially symmetrical with respect to the centerline of the display panel along the second direction D2. For example, the second detection line 32*a* may be located in a left half region of the bezel region, and the second detection line 32*b* may be located in a right half region of the bezel region. The second detection line 32*a* may include a fourth sub-trace 321*a* located in the first bezel region 21, a fifth sub-trace 322*a* located in the bending region 221, and a sixth sub-trace 323*a* located in the trace lead-out region 222. The second detection line 32*b* may include a fourth sub-trace 321*b* located in the first bezel region 21, a fifth sub-trace 322*b* located in the bending region 221, and a sixth sub-trace 323*b* located in the trace lead-out region 222. The fifth sub-traces 322*a* and 322*b* may be serpentine traces. The fifth sub-traces 322*a* and 322*b* may be wound in the bending region 221 along the second direction D2. One end of the fourth sub-trace 321*a* (or 321*b*) may be electrically connected with the second detection control unit 36, and the other end of the fourth sub-trace 321*a* (or 321*b*) may be electrically connected with one end of the fifth sub-trace 322*a* (or 322*b*). The other end of the fifth sub-trace 322*a* (or 322*b*) may be electrically connected with one end of the sixth sub-trace 323*a* (or 323*b*), and the other end of the sixth sub-trace 323*a* (or 323*b*) may be electrically connected with a first signal pin 391 located in the first signal access region 223 through the detection connection line 38.

In some examples, as shown in FIG. 3, the second detection control unit 36 may be located on a side of the second detection line 32*a* or 32*b* close to the display region 10. The second detection control unit 36 may include a second detection transistor. A gate electrode of the second detection transistor may be electrically connected with the detection control line 34, a first electrode of the second detection transistor may be electrically connected with a first end of the second detection line 32*a* or 32*b*, and a second electrode of the second detection transistor may be electrically connected with the second data line 12 in the display region 10.

In some examples, as shown in FIG. 3, the third detection line 33 may include a seventh sub-trace 331 located within the first bezel region 21, and an eighth sub-trace 332 extending from the first bezel region 21 to the second bezel region. For example, the seventh sub-trace 331 may be an annular trace surrounding the display region 10. One end of the eighth sub-trace 332 is electrically connected with the seventh sub-trace 331, and the other end of the eighth sub-trace 332 may be electrically connected with a second signal pin 392 within the first signal access region 223.

In some examples, as shown in FIG. 3, the third detection control unit 37 may include a third detection transistor. A gate electrode of the third detection transistor may be electrically connected with the detection control line 34, a first electrode of the third detection transistor may be electrically connected with the third detection line 33, and a second electrode of the third detection transistor may be electrically connected with the third data line 13 in the display region 10.

In some examples, as shown in FIG. 3, the detection control line 34 may include a ninth sub-trace 341 located within the first bezel region 21, and a tenth sub-trace 342 extending from the first bezel region 21 to the second bezel region. For example, the ninth sub-trace 341 may be an annular trace surrounding the display region 10. For example, the ninth sub-trace 341 may be located on a side of the seventh sub-trace 331 close to the display region 10. One end of the tenth sub-trace 342 is electrically connected with the ninth sub-trace 341, and the other end of the tenth sub-trace 342 may be electrically connected with a third signal pin 393 within the first signal access region 223. In this example, the detection control line 34 may provide a detection control signal configured to turn on or off a plurality of detection control units.

In some examples, the detection control unit includes a detection transistor that may be a P-type transistor, and the detection control line 34 causes the detection transistor to be turned on by supplying a detection control signal with a low level, and causes the detection transistor to be turned off by supplying a detection control signal with a high level. However, this embodiment is not limited thereto. For example, the detection transistor may be an N-type transistor, and the detection control line causes the detection transistor to be turned on by supplying a detection control signal with a high level, and causes the detection transistor to be turned off by supplying a detection control signal with a low level.

In some examples, during crack detection, the detection control signal provided by the detection control line 34 may cause the detection transistor to be turned on, so that all of the first detection control unit 35, the second detection control unit 36, and the third detection control unit 37 are turned on. The first detection lines 31*a* and 31*b*, the second detection lines 32*a* and 32*b* may receive a first detection signal (e.g. a high level signal), and the third detection line 33 may receive a second detection signal (e.g. a high level signal). When no crack is in the display panel, since all of the first detection control unit 35, the second detection control unit 36 and the third detection control unit 37 are turned on, the first detection lines 31*a* and 31*b* may be turned on with a corresponding first data line 11, the second detection lines 32*a* and 32*b* may be turned on with a corresponding second data line 12, and the third detection line 33 may be turned on with a corresponding third data line 13, thereby providing a first detection signal to the first data line 11 and the second data line 12, and providing a second detection signal to the third data line 13 so that display units electrically connected to those data lines do not emit light. Display units in the entire display region of the display panel appear black, i.e. the display region displays a dark image. Taking a crack existing in the first detection line 31*a* as an example, a voltage drop caused by an increase in a wiring resistance of the first detection line 31*a* prevents the first detection signal from being transmitted to the corresponding first data line 11. A display unit connected to the first data line 11 can emit light, a second data line can receive the first detection signal, a third data line can receive the second detection signal, and a display unit electrically connected to the second data line and the third data line does not emit light, thereby displaying a first bright line corresponding to the first data line 11 in the display region. Similarly, when a crack exists in the second detection line 32*a* or 32*b*, a second data line 12 electrically connected to the second detection line 32*a* or 32*b* cannot receive the first detection signal, the display unit electrically connected to the second data line 12 can emit light, and the display units electrically connected to the other data lines do not emit light, such that a second bright line corresponding to the second data line 12 can be displayed in the display region. In this way, a position where the crack occurs in the display panel can be identified according to positions of the first bright line and the second bright line.

In this example, a second detection signal is supplied, by a third detection control unit and a third detection line, to a data line which is not connected with the first detection line and the second detection line, such that a dark image is displayed in the display region, thereby facilitating human eye recognition when a bright line appears in the display region. In some other examples, the display panel may be not provided with a third detection control unit and a third detection line. At that time, during crack detection, a first detection signal can be directly supplied to data lines not connected with the first detection lines or the second detection lines, such that display units electrically connected to these data lines do not emit light.

Figure 4:
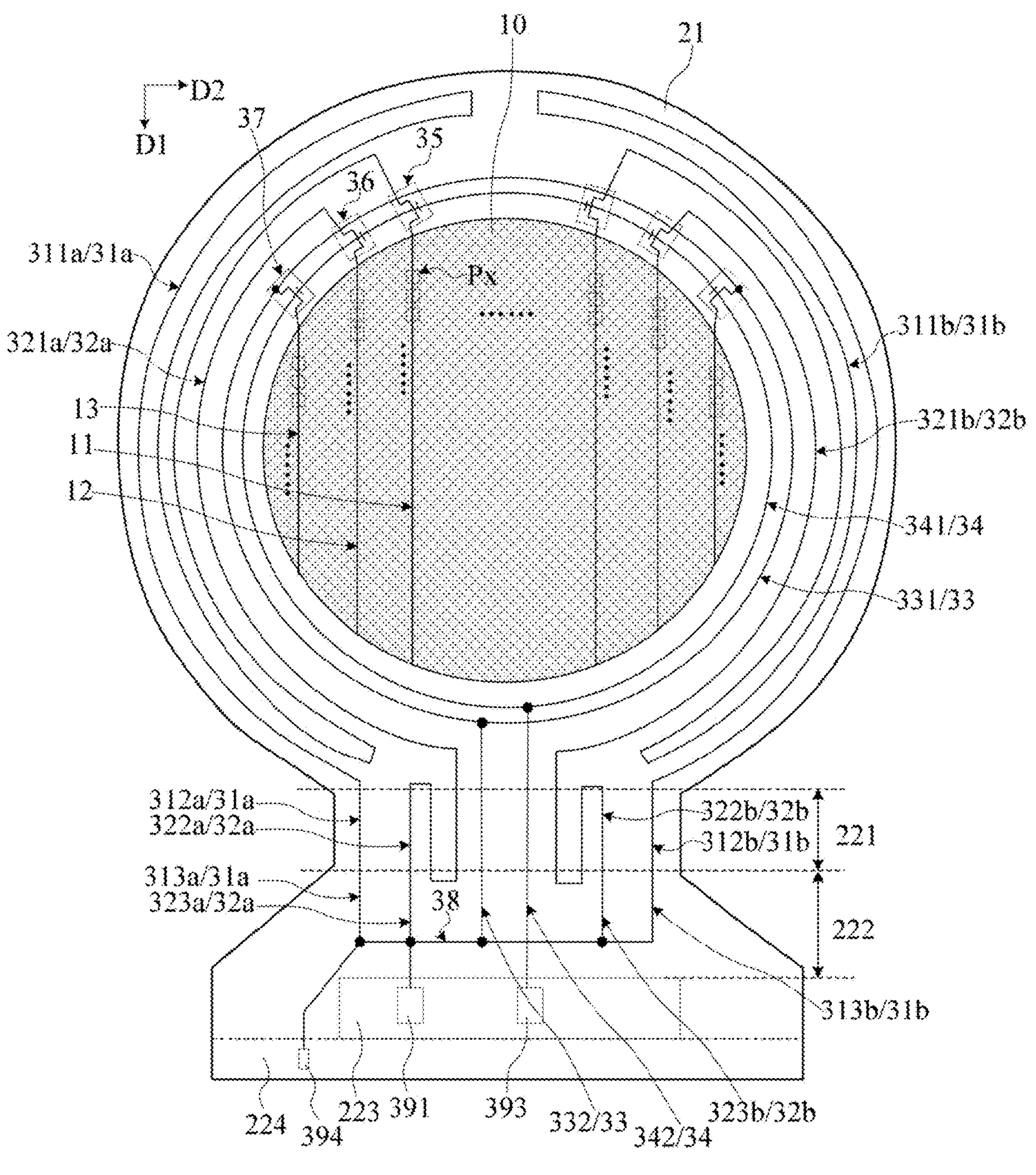
FIG. 4 is a partially schematic diagram of another trace in the bezel region of the display substrate according to at least one embodiment of the present disclosure.

FIG. 4 is a partially schematic diagram of another trace of a display substrate according to at least one embodiment of the present disclosure. In some examples, as shown in FIG. 4, the eighth sub-trace 332 of the third detection line 33 may be electrically connected with the detection connection line 38 in the second bezel region, so as to be configured to receive the first detection signal. In this example, the first signal access region 223 may be not provided with the second signal pin 392. The first detection lines 31*a* and 31*b*, the second detection lines 32*a* and 32*b*, and the third detection line 33 may receive a same first detection signal. The first detection lines 31*a* and 31*b*, the third detection line 33 may be configured to perform crack detection on the first bezel region and the second detection lines 32*a* and 32*b* may be configured to perform crack detection on the bending region. The rest of the structure of the display panel in the embodiment may refer to the description of the aforementioned embodiments, which will not be repeated here.

In some examples, during crack detection, the detection control signal provided by the detection control line 34 may cause the detection transistor to be turned on, so that all of the first detection control unit 35, the second detection control unit 36, and the third detection control unit 37 are turned on. The first detection lines 31*a* and 31*b*, the second detection lines 32*a* and 32*b*, and the third detection line 33 may receive the first detection signal (e.g. a high level signal). When no crack is in the display panel, since all of the first detection control unit 35, the second detection control unit 36 and the third detection control unit 37 are turned on, the first detection lines 31*a* and 31*b* may be turned on with a corresponding first data line 11, the second detection lines 32*a* and 32*b* may be turned on with a corresponding second data line 12, and the third detection line 33 may be turned on with a corresponding third data line 13, thereby providing the first detection signal to the first data line 11, the second data line 12 and the third data line 13, so that display units electrically connected to those data lines do not emit light. Display units in the entire display region of the display panel appear black, i.e. the display region displays a dark image. Taking a crack existing in the first detection line 31*a* as an example, a voltage drop caused by an increase in a wiring resistance of the first detection line 31*a* prevents the first detection signal from being transmitted to the corresponding first data line 11. A display unit connected to the first data line 11 can emit light, remaining data lines can receive the first detection signal, and display units electrically connected to the remaining data lines do not emit light, thereby displaying a first bright line corresponding to the first data line 11 in the display region. Similarly, when a crack exists in the second detection line 32*a* or 32*b*, a second data line 12 electrically connected to the second detection line 32*a* or 32*b* cannot receive the first detection signal, the display unit electrically connected to the second data line 12 can emit light, and the display units electrically connected to the other data lines do not emit light, such that a second bright line corresponding to the second data line 12 can be displayed in the display region. When a crack exists in the third detection line 33, a third data line 13 electrically connected to the third detection line 33 cannot receive the first detection signal, the display unit electrically connected to the third data line 13 can emit light, and the display units electrically connected to the other data lines do not emit light, such that a bright line corresponding to the third data line 13 can be displayed in the display region. In this way, a position where the crack occurs in the display panel can be identified according to positions of the bright lines. In this example, the first detection signal can achieve bezel crack detection through three groups of detection lines (the first detection line, the second detection line and the third detection line) synchronously, which can increase a detection range and improve a detection efficiency.

In some examples, when a display unit electrically connected to the first data line 11 corresponding to the first detection line 31*a* emits light to display the first bright line, existence of a crack in the first detection line 31*a* can be identified. When a display unit electrically connected to the first data line 11 corresponding to the first detection line 31*b* emits light to display the first bright line, existence of a crack in the first detection line 31*b* can be identified. When a display unit electrically connected to the second data line 12 corresponding to the second detection line 32*a* emits light to display the second bright line, existence of a crack in the second detection line 32*a* can be identified. When a display unit electrically connected to the second data line 12 corresponding to the second detection line 32*b* emits light to display the second bright line, existence of a crack in the second detection line 32*b* can be identified. When a display unit electrically connected to the third data line 13 corresponding to the third detection line 33 emits light to display the bright line, existence of a crack in the third detection line 33 can be identified. For example, the third detection line 33 may be configured to detect existence of a crack in a region surrounding the display region.

In this example, by setting the first detection line 31*a* to be wound in a left region of the first bezel region 21, the first detection line 31*a* may be configured to mainly detect existence of a crack in the left region of the first bezel region 21. By setting the first detection line 31*b* to be wound in a right region of the first bezel region 21, the first detection line 31*b* may be configured to mainly detect existence of a crack in the right region of the first bezel region 21. By setting the second detection line 32*a* to be wound in a left portion of the bending region 221, the second detection line 32*a* may be configured to mainly detect existence of a crack in the left portion of the bending region 221. By setting the second detection line 32*b* to be wound in a right portion of the bending region 221, the second detection line 32*b* may be configured to mainly detect existence of a crack in the right portion of the bending region 221.

In this example, the first detection line is connected to the first data line, the second detection line is connected to the second data line, and the first detection line and the second detection line can receive the first detection signal synchronously, so as to synchronously identify existence of a crack in the positions of the first detection line and the second detection line according to a display position of a bright line by performing crack detection on the first detection line and the second detection line synchronously, and further determine whether a crack occurs in the entire display panel. Compared with some implementations in which bright line detection is used for cracks in the first bezel region and resistance detection is used for cracks in the bending region, in this example, bright line detection is used simultaneously to detect existence of a crack in the first bezel region and the bending region, so as to reduce the detection process and time, greatly improve the production capacity, reduce the production cost and improve the yield of the display panel. In this example, the detection range can be increased by providing the first detection line and the second detection line and synchronously detecting the first detection line and the second detection line.

Figure 5:
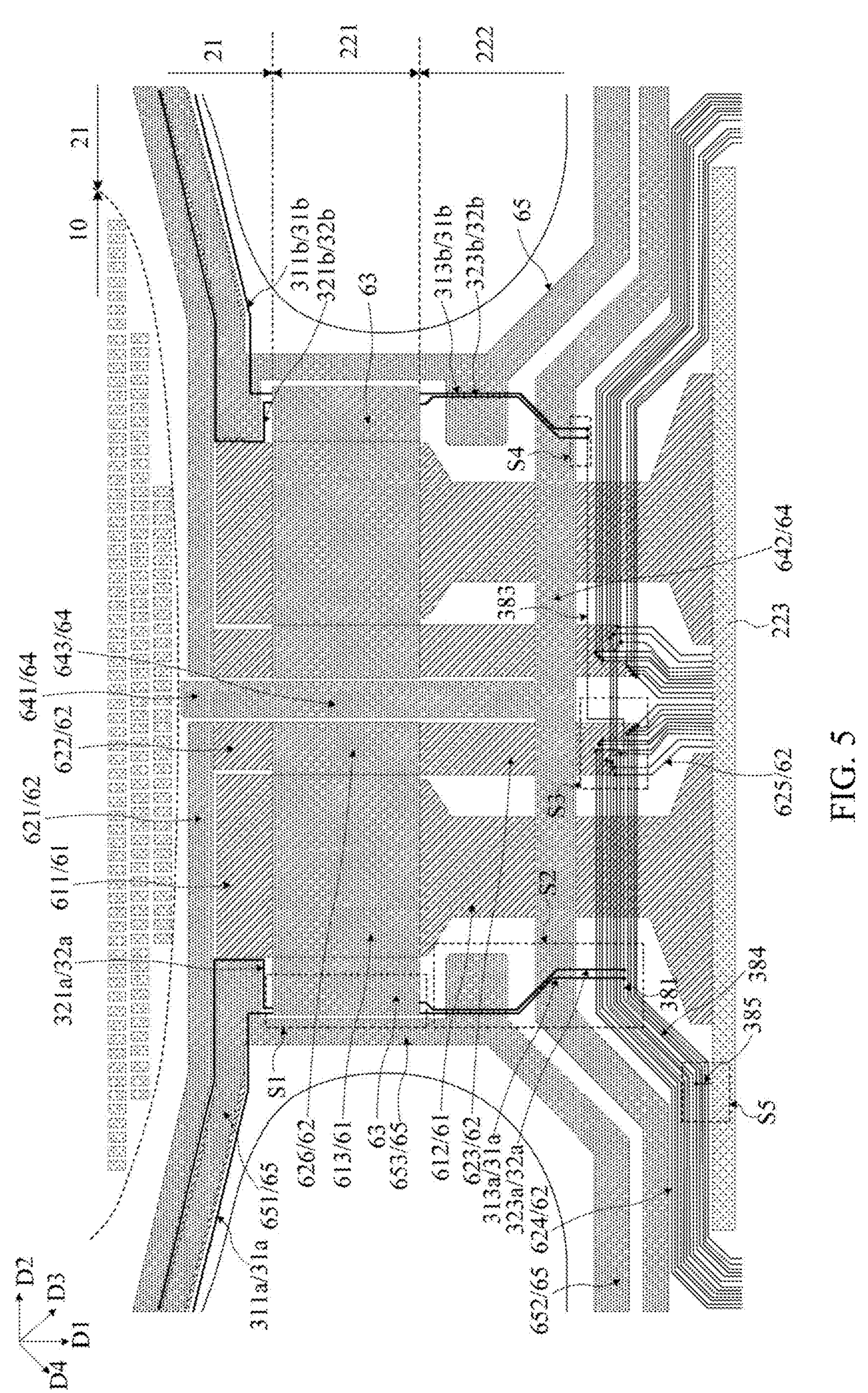
FIG. 5 is a partially schematic diagram of a trace in a first bezel region and a second bezel region according to at least one embodiment of the present disclosure.

FIG. 5 is a partially enlarged view of the first bezel region and the second bezel region according to at least one embodiment of the present disclosure. In some examples, as shown in FIG. 5, the bezel region may include a plurality of data leads 61 and a plurality of drive control signal lines 62. The plurality of data lead lines 61 may be substantially symmetrical with respect to the centerline of the display panel along the second direction D2, and the plurality of drive control signal lines 62 may be substantially symmetrical with respect to the centerline of the display panel along the second direction D2. In FIG. 5, the plurality of data leads and the plurality of drive control signal lines are schematically illustrated as a whole. In this embodiment, quantities of data lead lines and drive control signal lines are not limited. A circuit configuration of the first bezel region 21 (including for example a gate driving circuit, a multiplexing circuit, a test circuit, an electrostatic discharge circuit and the like) is omitted in FIG. 5.

In some examples, as shown in FIG. 5, at least one data lead line 61 may include a first sub-data lead line 611 located in the first bezel region 21, a data connection line 613 located in the bending region 221 and extending in the first direction D1, and a second sub-data lead line 612 located in the trace lead-out region 222 and extending in the first direction D1. The first sub-data lead line 611 and the second sub-data lead line 612 are electrically connected through the data connection line in the bending region 221. For example, after being electrically connected with the multiplexing circuit, the first sub-data lead line 611 may extend along an edge shape of the display region to a region of the first bezel region 21 close to the bending region 221, and then extend toward the bending region 221 along the first direction D1. The second sub-data lead line 612 may be configured to be electrically connected to an integrated circuit in the first signal access region 223. In some examples, the first sub-data lead line 611 and the second sub-data lead line 612 may be disposed on a same layer as the first gate metal layer or the second gate metal layer in the display region, and the data connection line 613 may be disposed on a same layer as the first source-drain metal layer in the display region.

In some examples, as shown in FIG. 5, at least one drive control signal line 62 may include a first sub-drive control signal line 621 and a second sub-drive control signal line 622 located in the first bezel region 21, a drive control connection line 626 located in the bending region 221, a third sub-drive control signal line 623 located in the trace lead-out region 222, a fourth sub-drive control signal line 624 and a fifth sub-drive control signal line 625. The first sub-drive control signal line 621 may extend along the edge shape of the display region 10 and is electrically connected to the electrostatic discharge circuit and then to the second sub-drive control signal line 622 extending along the first direction D1. The second sub-drive signal control line 622 may be electrically connected with the third sub-drive signal control line 623 extending along the first direction D1 through the drive control connection line 626 extending along the first direction D1. The third sub-drive control signal line 623 may be electrically connected with the fourth sub-drive control signal line 624 extending at least along the second direction D2, and may also be electrically connected with the fifth sub-drive control signal line 625. The fifth sub-drive control signal line 625 may be electrically connected with a signal pin in the first signal access region 223, and the fourth sub-drive control signal line 624 may be electrically connected with a bonding pin in the second signal access region.

In some examples, as shown in FIG. 5, the bezel region may also be provided with a plurality of touch signal lines. The touch signal lines may include a first sub-touch signal line (not shown) located in the first bezel region, a touch connection line 63 located in the bending region 221, and a second sub-touch signal line (not shown) located in the trace lead-out region. The second sub-touch signal line may extend along the first direction D1 to the first signal access region 223, and may be electrically connected with a TDDI circuit, for example. The touch connection line 63 may be disposed in a same layer as the first source-drain metal layer in the display region. In some other examples, a second sub-touch signal line located in the trace lead-out region may extend along the first direction D1 and a fourth direction D4 to the second signal access region, be electrically connected with the signal pins of the second signal access region, and be electrically connected with a Flexible Circuit Board (FPC for short) through a signal pin in the second signal access region. For example, in the second bezel region, the touch signal line may be located on a side of a second power supply line 65 away from a first power supply line 64.

In some examples, as shown in FIG. 5, the bezel region is further provided with the first power supply line 64 and the second power supply line 65. For example, the first power supply line 64 and the second power supply line 65 may be of a same layer structure. The first power supply lines 64 and the second power supply lines 65 may be arranged in a same layer as the first source-drain metal layer in the display region.

In some examples, as shown in FIG. 5, the first power supply line 64 may include a first sub-power supply line 641 located in the first bezel region 21, a first power supply connection line 643 located in the bending region 221, and a second sub-power supply line 642 located in the trace lead-out region 222. The first power supply connection line 643 may be electrically connected to the first sub-power supply line 641 and the second sub-power supply line 642. The second sub-power supply line 642 may extend along the first direction D1, then to two sides in the second direction D2, and then to the second signal access region in the third direction D3 and the fourth direction D4, respectively, so as to be electrically connected with the bonding pin in the second signal access region. Both of the third direction D3 and the fourth direction D4 are intersected with the first direction D1 and the second direction D2, and the third direction D3 is intersected with the fourth direction D4. For example, the third direction D3 may be perpendicular to the fourth direction D4.

In some examples, as shown in FIG. 5, the second power supply line 65 may be located on a side of the first power supply line 64 close to an edge of the display panel. The second power supply line 65 may include a third sub-power supply line 651 located in the first bezel region 21, a second power supply connection line 653 located in the bending region 221, and a fourth sub-power supply line 652 located in the trace lead-out region 222. The fourth sub-power supply line 652 located in a left region of the second bezel region may extend in the first direction D1 at first, and then extend to the second signal access region in the fourth direction D4. The fourth sub-power supply line 652 located in a right region of the second bezel region may extend in the first direction D1 at first, and then extend to the second signal access region in the third direction D3. The fourth sub-power supply line 652 may be electrically connected with the bonding pin in the second signal access region.

In some examples, as shown in FIG. 5, in a part of the first bezel region 21, the first sub-trace 311*a* of the first detection line 31*a* may be located on a side of the third sub-trace 651 of the second power supply line 65 away from the display region 10, and the fourth sub-trace 321*a* of the second detection line 32*a* may be located on a side of the third sub-trace 651 of the second power supply line 65 close to the display region 10. Similarly, the first sub-trace 311*b* of the first detection line 31*b* may be located on the side of the third sub-power supply line of the second power supply line away from the display region 10, and the fourth sub-trace 321*b* of the second detection line 32*b* may be located on the side of the third sub-power supply line of the second power supply line close to the display region 10.

Figure 6:
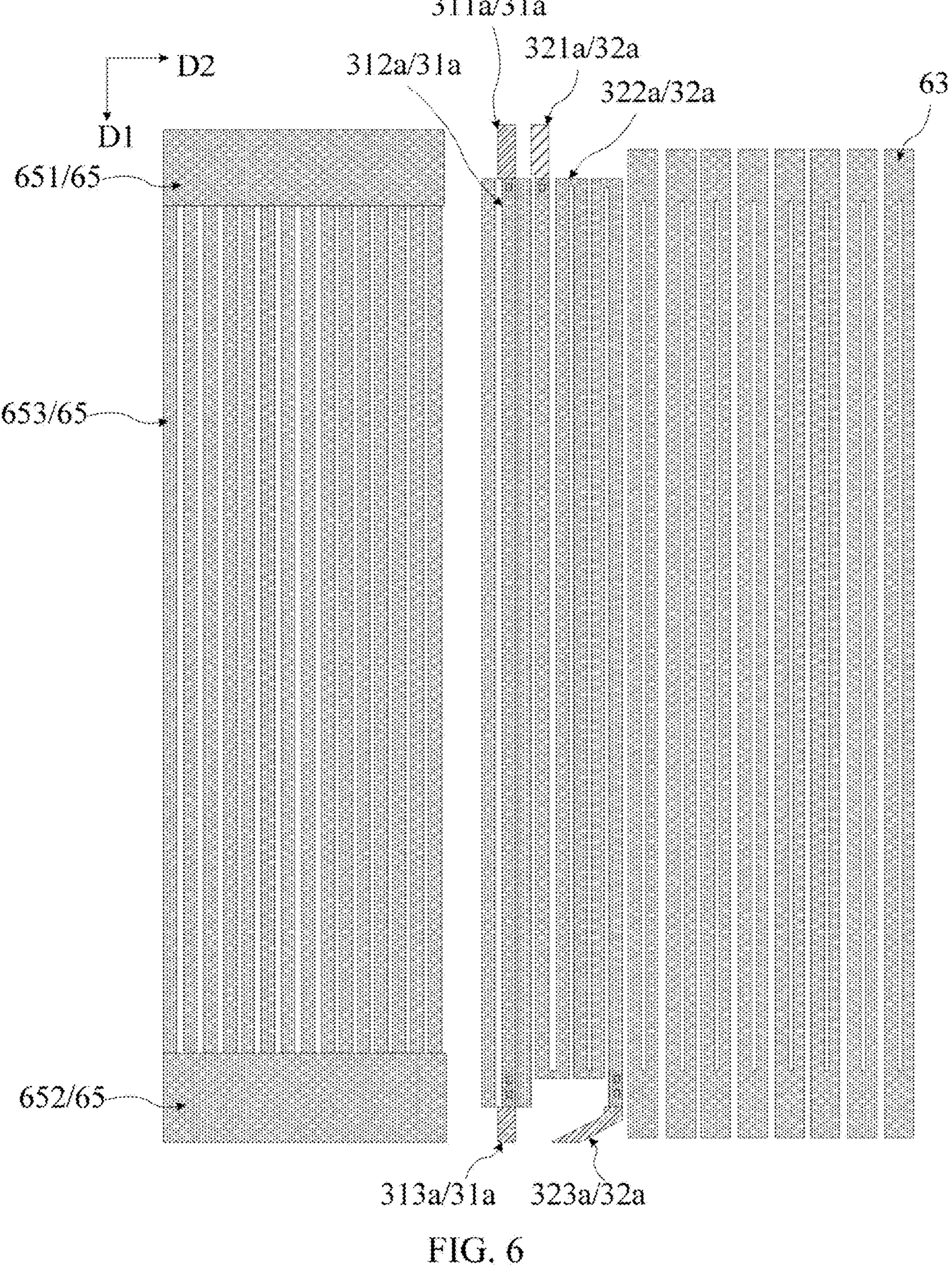
FIG. 6 is a partially enlarged view of a region S1 in FIG. 5.

FIG. 6 is a partially enlarged view of a region S1 in FIG. 5. In some examples, as shown in FIGS. 5 and 6, the second sub-trace 312*a* of the first detection line 31*a* may be a straight line segment extending in the first direction D1. The first sub-trace 311*a* and the third sub-trace 313*a* may be of a same layer structure, for example disposed in a same layer as the second gate metal layer in the display region. The second sub-trace 312*a* may be disposed in a same layer as the first source-drain metal layer in the display region. One end of the second sub-trace 312*a* may be electrically connected with the first sub-trace 311*a* through a via opened in the third insulation layer, and another end of the second sub-trace 312*a* may be electrically connected with the third sub-trace 313*a* through a via opened in the third insulation layer. The fifth sub-trace 322*a* of the second detection line 32*a* may include a plurality (e.g. five) of first straight line segments in the first direction D1 and a second straight line segment extending in the second direction D2 to connect adjacent first straight line segments. The second straight line segment may connect a plurality of first straight line segments in series. The fifth sub-trace 322*a* may be disposed in a same layer as the first source-drain metal layer in the display region. The fourth sub-trace 321*a* may be disposed in the same layer as the first gate metal layer in the display region, and the sixth sub-trace 323*a* may be disposed in the same layer as the second gate metal layer in the display region. One end of the fifth sub-trace 322*a* may be electrically connected with the fourth sub-trace 321*a* through a via opened in the third insulation layer and the second insulation layer, and another end of the fifth sub-trace 322*a* may be electrically connected with the sixth sub-trace 323*a* through a via opened in the third insulation layer. In this example, the larger a quantity of the first straight line segments of the fifth sub-trace 322*a*, the wider a range of the bending region that the second detection line 32*a* can detect.

In some examples, as shown in FIGS. 5 and 6, the second sub-traces 312*a* of the first detection line 31*a* and the fifth sub-traces 322*a* of the second detection line 32*a* may be located between the second power supply connection line 653 of the second power supply line 65 and a plurality of touch connection lines 63, in the bending region 221. The fifth sub-trace 322*a* of the second detection line 32*a* may be located on a side of the second sub-trace 312*a* of the first detection line 31*a* away from the second power supply connection line 653 of the second power supply line 65. In this example, by setting the second detection line on a side of the second power supply line away from the edge of the display panel in the bending region, it helps the second detection line to detect a crack in the bending region. In addition, the first detection line and the second detection line are disposed adjacent to each other in the bending region to facilitate a trace arrangement.

Figure 7:
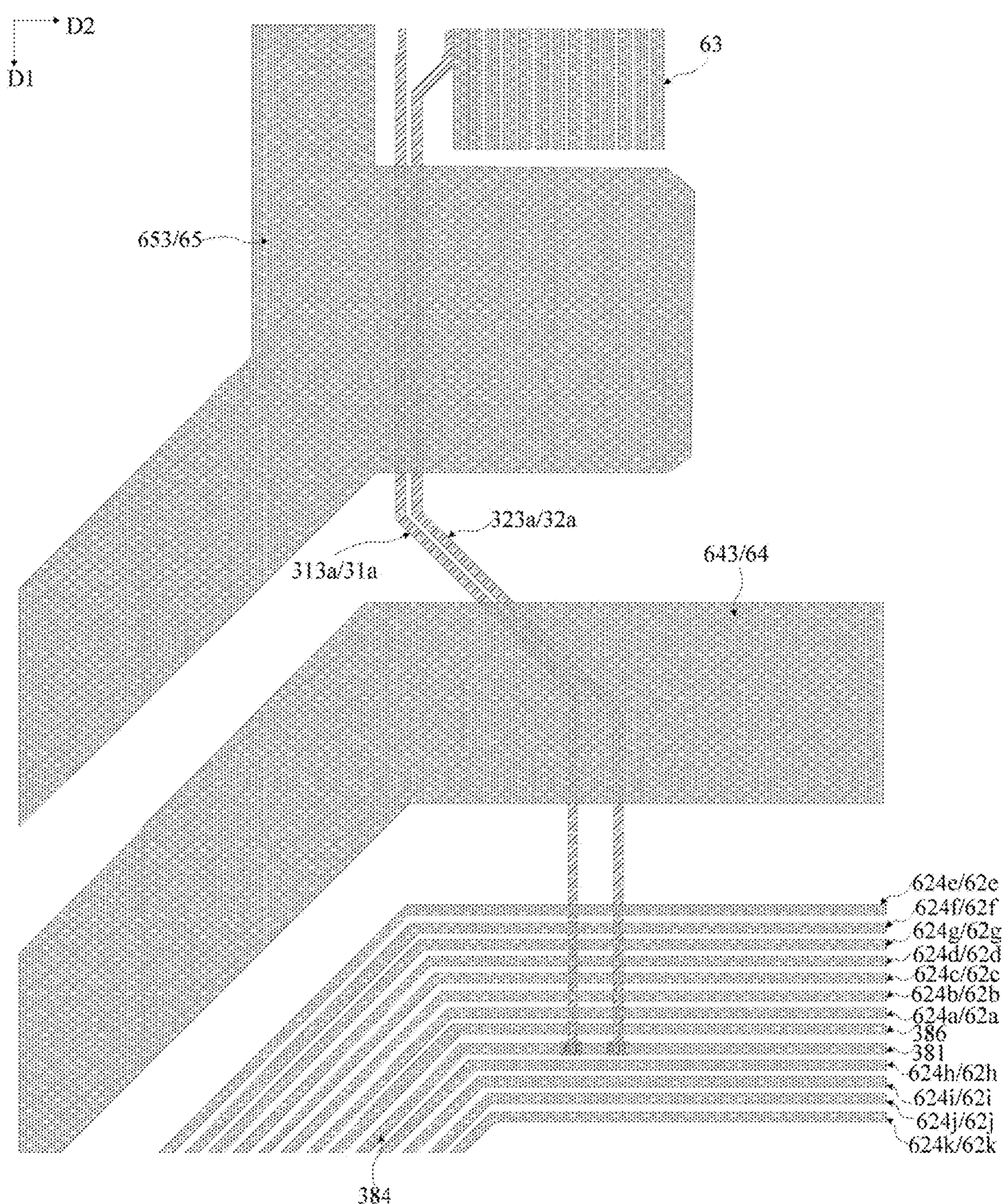
FIG. 7 is a partially enlarged view of a region S2 in FIG. 5.

FIG. 7 is a partially enlarged view of a region S2 in FIG. 5. In some examples, as shown in FIGS. 5 to 7, the third sub-trace 313*a* of the first detection line 31*a* may extend in the first direction D1 to a side away from the display region at first, then extend in the third direction D3 to the centerline of the display panel in the second direction, and then extend in the first direction D1 to the side away from the display region. An extension direction of the sixth sub-trace 323*a* of the second detection line 32*a* is substantially the same as an extension direction of the third sub-trace 313*a*. The sixth sub-trace 323*a* may be located on a side of the third sub-trace 313*a* close to the centerline of the display panel in the second direction. Structures of the first detection line 31*b* and the second detection line 32*b* can refer to the structures of the first detection line 31*a* and the second detection line 32*a*, which are not be repeated here.

Figures 8, 9:
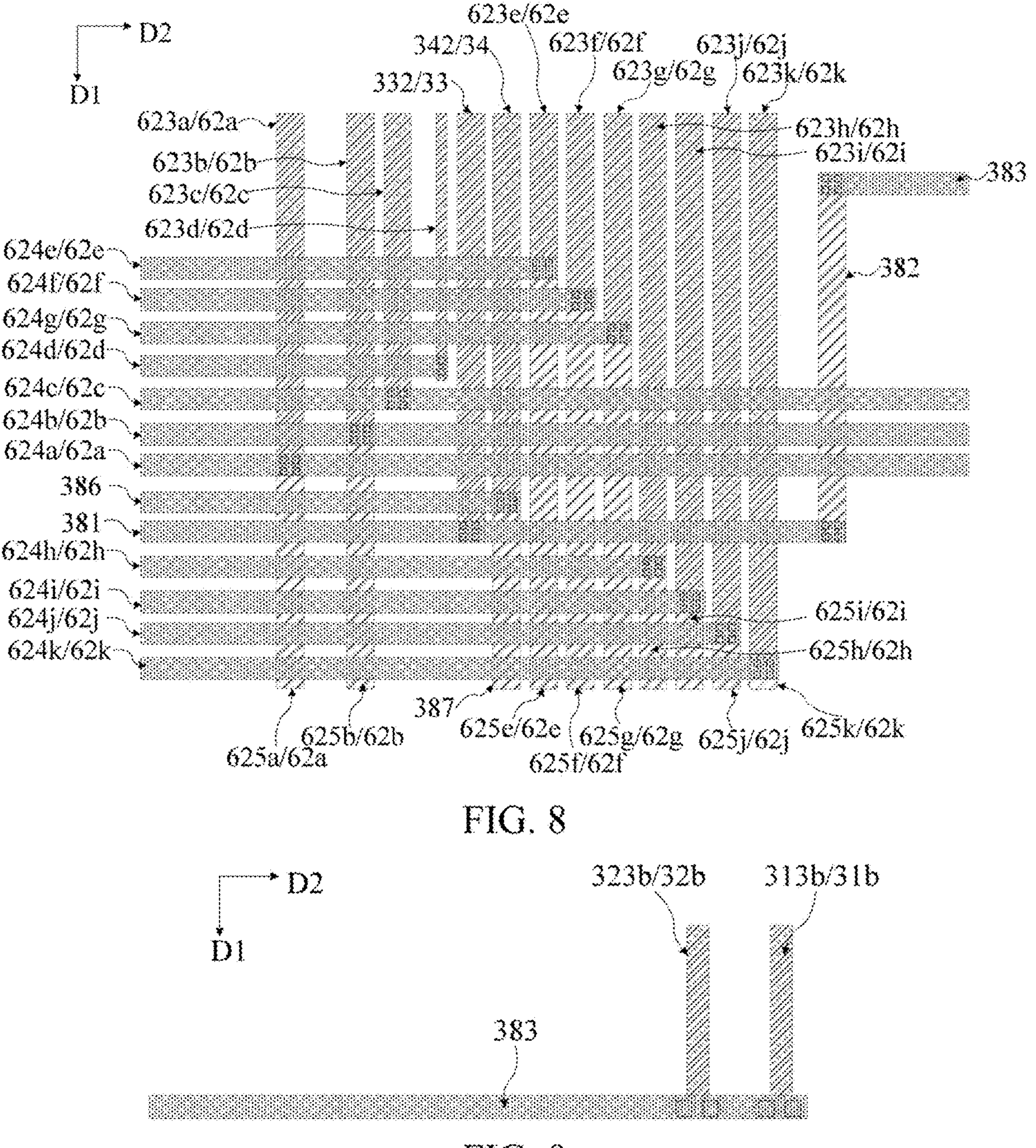
FIG. 8 is a partially enlarged view of a region S3 in FIG. 5.
FIG. 9 is a partially enlarged view of a region S4 in FIG. 5.

FIG. 8 is a partially enlarged view of a region S3 in FIG. 5. FIG. 9 is a partially enlarged view of a region S4 in FIG.

Figure 10:
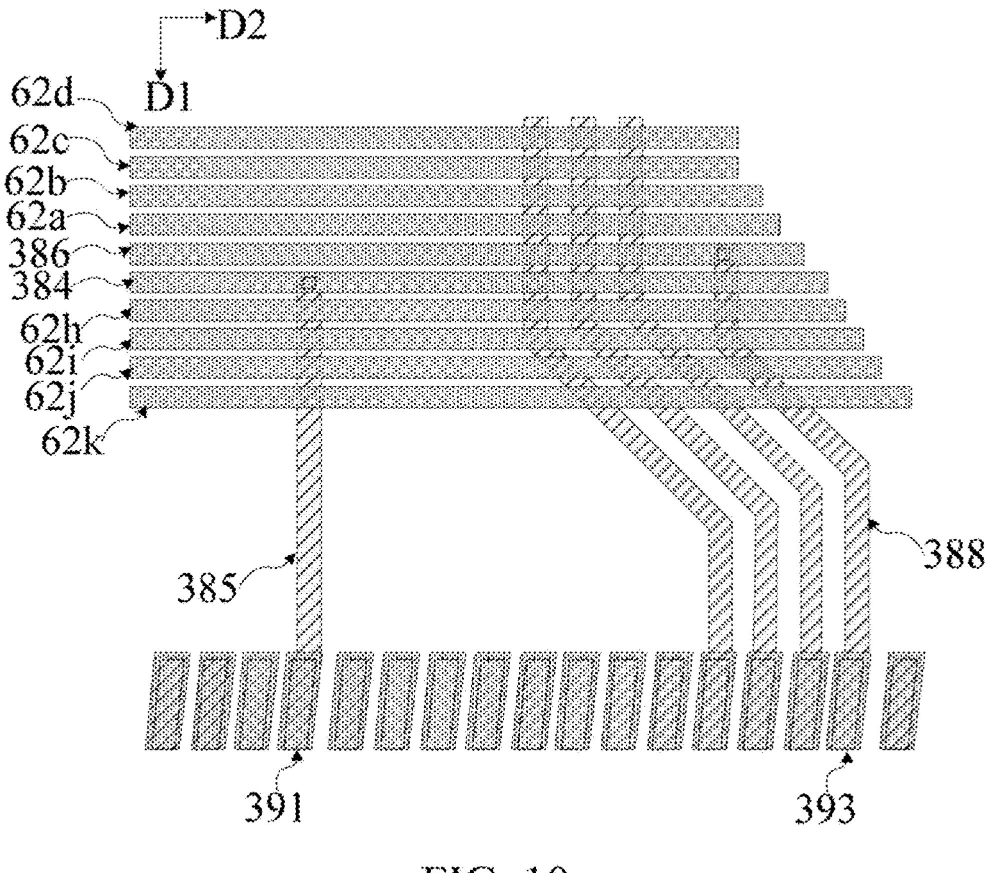
FIG. 10 is a partially enlarged view of a region S5 in FIG. 5.

5. FIG. 10 is a partially enlarged view of a region S5 in FIG. 5. In some examples, as shown in FIGS. 5 to 10, the third sub-trace 313*a* of the first detection line 31*a* may be electrically connected with a first detection connection line 381, and the sixth sub-trace 323*a* of the second detection line 32*a* may be electrically connected with the first detection connection line 381. The first detection connection line 381 may extend in the second direction D2, a first end of the first detection connection line 381 may be electrically connected with a fourth detection connection line 384 extending in the fourth direction D4, the fourth detection connection line 384 may be electrically connected with a fifth detection connection line 385, and the fifth detection connection line 385 may be electrically connected with a first signal pin in the first signal access region. The fourth detection connection line 384 may extend to the second signal access region in the fourth direction D4, the second direction D2, the fourth direction D4, and the first direction D1 in turn, and is electrically connected with a fourth signal pin in the second signal access region. A second end of the first detection connection line 381 may be electrically connected with a first end of the second detection connection line 382 extending in the first direction D1 toward the display region, and a second end of the second detection connection line 382 may be electrically connected with the third detection connection line 383 extending in the second direction D2. The third sub-trace 313*b* of the first detection line 31*b* and the sixth sub-trace 323*b* of the second detection line 32*b* may be electrically connected with the third detection connection line 383. The first detection connection line 381, the second detection connection line 382 and the third detection connection line 383 may be located on a side of the first power supply line 64 away from the display region 10. In some examples, the fourth detection connection line 384 and the first detection connection line 381 may be of an integral structure. The first detection connection line 381 and the third detection connection line 383 may be disposed in the same layer as the first source-drain metal layer in the display region, and the second detection connection line 382 may be disposed in the same layer as the first gate metal layer in the display region.

In this example, the detection connection line 38 may include the first detection connection line 381, the second detection connection line 382, the third detection connection line 383, the fourth detection connection line 384 and the fifth detection connection line 385. The electrical connection of the two first detection lines 31*a* and 31*b* with the two second detection lines 32*a* and 32*b* can be achieved by the first detection connection line 381, the second detection connection line 382 and the third detection connection line 383. The electrical connections of the two first detection lines 31*a* and 31*b* and the two second detection lines 32*a* and 32*b* with a same first signal pin in the first signal access region can be achieved by the fourth detection connection line 384 and the fifth detection connection line 385. The electrical connection with the fourth signal pin in the second signal access region can also be achieved by the fourth detection connection line 384. A wiring mode in this example can save a wiring space.

In some examples, as shown in FIG. 8, the first detection connection line 381 may also be electrically connected with the eighth sub-trace 332 of the third detection line 33 to enable provision of the first detection signal to the third detection line 33. In this example, the third detection line 33 may receive the first detection signal provided by the first signal pin, likewise. A connection mode in this example can save the wiring space and reduce a space occupied by the signal pins.

In some examples, as shown in FIGS. 7 and 8, the tenth sub-trace 342 of the detection control line 34 may extend in the trace lead-out region 222 in the first direction D1, and may be electrically connected with the first control connection line 386, and may also be electrically connected with the second control connection line 387. An extension direction of the first control connection line 386 is substantially the same as an extension direction of the first detection connection line 381, and the first control connection line 386 and the first detection connection line 381 are adjacent in the first direction D1.

In some examples, as shown in FIGS. 5 to 8, the plurality of drive control signal lines 62 may include a first voltage line 62*a*, a second voltage line 62*b*, an initial signal (INIT) line 62*c*, an output signal line 62*d*, a start signal (STV) line 62*e*, a first clock signal line 62*f*, a second clock signal line 62*g*, a test control line 62*h*, a first test signal line 62*i*, a second test signal line 62*j*, and a third test signal line 62*k*. The first voltage line 62*a* and the second voltage line 62*b* may be configured to supply a power supply signal to the gate drive circuit. The first clock signal line 62*f* and the second clock signal line 62*g* may be configured to provide a clock signal to the gate drive circuit. The initial signal line 62*e* may be configured to provide a start signal to the gate drive circuit. The initial signal line 62*c* may be configured to provide an initial signal to the pixel circuit. The output signal line 62*d* may be configured to transmit an output signal of the gate drive circuit. The test control line 62*h*, the first test signal line 62*i*, the second test signal line 62*j* and the third test signal line 62*k* may be configured to provide signals to the test circuit.

In some examples, as shown in FIG. 8, a third sub-drive control signal line 623*a* of the first voltage line 62*a*, a third sub-drive control signal line 623*b* of the second voltage line 62*b*, a third sub-drive control signal line 623*c* of the initial signal line 62*c*, a third sub-drive control signal line 623*d* of the output signal line 62*d*, the eighth sub-trace 332 of the third detection line 33, the tenth sub-trace 342 of the detection control line 34, a third sub-drive control signal line 623*e* of the initial signal line 62*e*, a third sub-drive control signal line 623*f* of the first clock signal line 62*f*, a third sub-drive control signal line 623*g* of the second clock signal line 62*g*, a third sub-drive control signal line 623*h* of the test control line 62*h*, a third sub-drive control signal line 623*i* of the first test signal line 62*i*, a third sub-drive control signal line 623*j* of the second test signal line 62*j* and a third sub-drive control signal line 623*k* of the third test signal line 62*k* may be arranged in sequence in the second direction D2.

In some examples, as shown in FIGS. 7 and 8, a fourth sub-drive control signal line 624*e* of the initial signal line 62*e*, a fourth sub-drive control signal line 624*f* of the first clock signal line 62*f*, a fourth sub-drive control signal line 624*g* of the second clock signal line 62*g*, a fourth sub-drive control signal line 624*d* of the output signal line 62*d*, a fourth sub-drive control signal line 624*d* of the initial signal line 62*c*, a fourth sub-drive control signal line 624*b* of the second voltage line 62*b*, a fourth sub-drive control signal line 624*a* of the first voltage line 62*a*, the first control connection line 385, the first detection connection line 381, a fourth sub-drive control signal line 624*h* of the test control line 62*h*, a fourth sub-drive control signal 624*i* of the first test signal line 62*i*, a fourth sub-drive control signal line 624*j* of the second test signal line 62*j* and a fourth sub-drive control signal line 624*k* of the third test signal line 62*k* may be arranged in sequence in the first direction D1.

In some examples, as shown in FIG. 8, the third sub-drive control signal line 623*a* of the first voltage line 62*a* is electrically connected with the fourth sub-drive control signal line 624*a* and the fifth sub-drive control signal line 625*a*. The third sub-drive control signal line 623*b* of the second voltage line 62*b* is electrically connected with the fourth sub-drive control signal line 624*b* and the fifth sub-drive control signal line 625*b*. The third sub-drive control signal line 623*c* of the initial signal line 62*c* is electrically connected with the fourth sub-drive control signal line 624*c*. The third sub-drive control signal line 623*d* of the output signal line 62*d* is electrically connected with the fourth sub-drive control signal line 624*d*. The third sub-drive control signal line 623*e* of the initial signal line 62*e* is electrically connected with the fourth sub-drive control signal line 624*e* and the fifth sub-drive control signal line 625*e*. The third sub-drive control signal line 623*f* of the first clock signal line 62*f* is electrically connected with the fourth sub-drive control signal line 624*f* and the fifth sub-drive control signal line 625*f*. The third sub-drive control signal line 623*g* of the second clock signal line 62*g* is electrically connected with the fourth sub-drive control signal line 624*g* and the fifth sub-drive control signal line 625*g*. The third sub-drive control signal line 623*h* of the test control line 62*h* is electrically connected with the fourth sub-drive control signal line 624*h* and the fifth sub-drive control signal line 625*h*. The third sub-drive control signal line 623*i* of the first test signal line 62*i* is electrically connected with the fourth sub-drive control signal line 624*i* and the fifth sub-drive control signal line 625*i*. The third sub-drive control signal line 623*j* of the second test signal line 62*j* is electrically connected with the fourth sub-drive control signal line 624*j* and the fifth sub-drive control signal line 625*j*. The third sub-drive control signal line 623*k* of the third test signal line 62*k* is electrically connected with the fourth sub-drive control signal line 624*k* and the fifth sub-drive control signal line 625*k*.

In this example, the first detection connection line 381 is arranged within a plurality of fourth sub-drive control signal lines, which facilitates connecting with the third detection line 33, and signal transfer can be achieved through the second detection connection line 382 and the third detection connection line 383. The wiring mode in this example may save a space occupied by a wiring and a pin, and avoid affecting other signals.

In some examples, as shown in FIG. 10, the fourth detection connection line 384 may be electrically connected with the first signal pin 391 located in the first signal access region through the fifth detection connection line 385. For example, the first signal pin 391 may include a first sub-pin and a second sub-pin that are stacked and electrically connected with each other. The fifth detection connection line 385 may be electrically connected with the first sub-pin. The fifth detection connection line 385 and the first sub-pin may be of an integral structure, for example, may be disposed in the same layer as the first gate metal layer in the display region. The second sub-pin may be disposed in the same layer as the first source-drain metal layer in the display region. The first control connection line 386 may be electrically connected with a third control connection line 388 that may be electrically connected with a third signal pin 393 located in the first signal access region. A connection mode between the third control connection line 388 and the third signal pin 393 is similar to a connection mode between the fifth detection connection line 385 and the first signal pin 391, which is not repeated here. A side of the third control connection line 388 close to the fifth detection connection line 385 may be further provided with connection lines of the initial signal line 62*e*, the first clock signal line 62*f*, and the second clock signal line 62*g* to corresponding signal pins in the first signal access region in sequence.

A manufacturing process of the display panel in this exemplary embodiment may be implemented by an existing mature manufacture equipment, and is compatible well with an existing manufacturing process, simple in process implementation, easy to implement, high in a production efficiency, low in a production cost, and high in a yield.

A method for detecting a crack is also provided in an embodiment, which is applied to the display panel as described above, and includes: when detecting a crack in a display panel, a first detection line and a first data line are electrically connected through a first detection control unit, a second detection line and a second data line are electrically connected through a second detection control unit, and a first detection signal is provided to the first detection line and the second detection line; whether a crack exists in the first detection line or the second detection line is determined based on light emitting states of a plurality of display units electrically connected to the first data line and the second data line.

In some examples, a plurality of display units electrically connected to the first data line emit light to form a first bright line in the display region, then it is determined that there is a crack existing in the first detection line (e.g. the first bezel region). When a plurality of display units electrically connected to the second data line emit light to form a second bright line in the display region, it is determined that there is a crack existing in the second detection line (e.g. the bending region).

The method for detecting a crack provided in the example can perform crack detection on the first detection line and the second detection line synchronously, so as to save the detection process, and achieve effective and rapid detection of the first bezel region and the bending region, thereby effectively controlling the production cost and improving the yield of the display panel.

A display apparatus is also provided in an embodiment of the present disclosure, including the display panel in the aforementioned embodiments.

Figure 11:
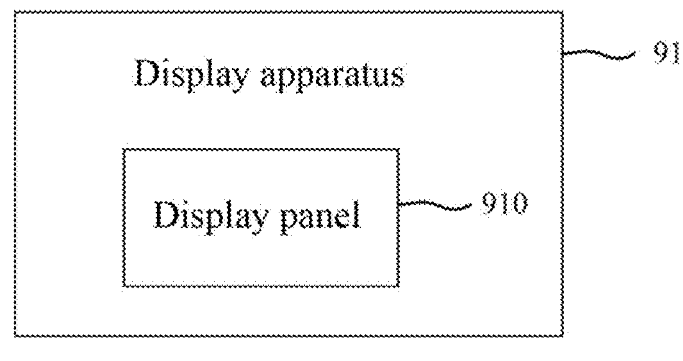
FIG. 11 is a schematic diagram of a display apparatus according to at least one embodiment of the present disclosure.

FIG. 11 is a schematic diagram of a display apparatus according to at least one embodiment of the present disclosure. In some examples, as shown in FIG. 11, a display panel 910 may be an OLED display panel. A display apparatus 91 may be any product or component with a display function, such as an OLED display apparatus, a mobile phone, a tablet computer, a television, a display, a notebook computer, a digital photo frame, or a navigator. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments in case of no contradictions. Those of ordinary skills in the art should understand that modifications or equivalent replacements may be made to the technical solutions of the present disclosure without departing from the essence and scope of the technical solutions of the present disclosure, and should all fall within the scope of the claims of the present disclosure.

The invention claimed is:

1. A display panel, comprising:

a substrate comprising a display region and a bezel region located around the display region, wherein the bezel region comprises a first bezel region surrounding the display region and a second bezel region located on a side of the first bezel region away from the display region; and the second bezel region at least comprises a bending region;

a plurality of display units, at least one first data line and at least one second data line located in the display region, wherein the first data line and the second data line are electrically connected to different parts of the plurality of display units, respectively;

at least one first detection control unit and at least one second detection control unit;

at least one first detection line partially located in the first bezel region, wherein a first end of the first detection line is electrically connected with the first data line through the first detection control unit, and a second end of the first detection line is configured to receive a first detection signal; and at least one second detection line partially located in the bending region of the second bezel region, wherein a first end of the second detection line is electrically connected with the second data line through the second detection control unit, and a second end of the second detection line is configured to receive the first detection signal, wherein the second bezel region further comprises a trace lead-out region and a signal access region located on a side of the bending region away from the display region;

wherein in the trace lead-out region, the first detection line and the second detection line are electrically connected through a detection connection line;

wherein the at least one first detection line comprises two first detection lines located on two sides of the display region in a second direction, and the at least one second detection line comprises two second detection lines located on two sides of the display region in the second direction;

wherein detection connection lines comprise a first detection connection line, a second detection connection line and a third detection connection line electrically connected in sequence, wherein the first detection connection line is electrically connected with one first detection line of the two first detection lines and one second detection line of the two second detection lines located on a side of the display region, and the third detection connection line is electrically connected with another first detection line of the two first detection lines and another second detection line of the two second detection lines located on another side of the display region; and wherein the first detection connection line and the third detection connection line extend in the second direction, the second detection connection line extends in the first direction, and the first direction intersects with the second direction.

2. The display panel of claim 1, wherein a first plurality of the plurality of display units electrically connected to the first data line are configured to emit light to display a first bright line when the first detection control unit is turned on and a crack occurs in the first detection line;

a second plurality of the plurality of display units electrically connected to the second data line are configured to emit light to display a second bright line when the second detection control unit is turned on and a crack occurs in the second detection line.

3. The display panel of claim 2, wherein the second end of the first detection line and the second end of the second detection line are electrically connected to a same first signal pin.

4. The display panel of claim 2, wherein the second bezel region further comprises a trace lead-out region and a signal access region located on a side of the bending region away from the display region;

in the trace lead-out region, the first detection line and the second detection line are electrically connected through a detection connection line, and the detection connection line is electrically connected with a first signal pin in the signal access region.

5. The display panel of claim 2, wherein the first detection line comprises a first sub-trace located in the first bezel region, and the first sub-trace is a serpentine line;

the second detection line comprises a fifth sub-trace located in the bending region, and the fifth sub-trace is a serpentine line.

6. The display panel of claim 1, wherein the second end of the first detection line and the second end of the second detection line are electrically connected to a same first signal pin.

7. The display panel of claim 6, wherein the second bezel region further comprises a trace lead-out region and a signal access region located on a side of the bending region away from the display region;

in the trace lead-out region, the first detection line and the second detection line are electrically connected through a detection connection line, and the detection connection line is electrically connected with a first signal pin in the signal access region.

8. The display panel of claim 6, wherein the first detection line comprises a first sub-trace located in the first bezel region, and the first sub-trace is a serpentine line;

the second detection line comprises a fifth sub-trace located in the bending region, and the fifth sub-trace is a serpentine line.

9. The display panel of claim 1, wherein the detection connection line is electrically connected with a first signal pin in the signal access region.

10. The display panel of claim 1, wherein the first detection connection line and the third detection connection line are of a same layer structure, and the second detection connection line is located on a side of the first detection connection line close to the substrate.

11. The display panel of claim 1, wherein the first detection line comprises a first sub-trace located in the first bezel region, and the first sub-trace is a serpentine line;

the second detection line comprises a fifth sub-trace located in the bending region, and the fifth sub-trace is a serpentine line.

12. The display panel of claim 1, wherein in the first bezel region, at least part of the first detection line is located on a side of the second detection line away from the display region.

13. The display panel of claim 1, wherein the bezel region further comprises a first power supply line and a second power supply line; in the bending region, the second power supply line is located on a side of the first detection line and the second detection line away from the first power supply line.

14. The display panel of claim 1, further comprising at least one third data line located in the display region, at least one third detection line partially located in the first bezel region, and at least one third detection control unit located in the bezel region; wherein a first end of the third detection line is electrically connected with the third data line through the third detection control unit, and a second end of the third detection line is configured to receive a second detection signal;

a third plurality of the plurality of display units electrically connected to the third data line are configured to display a dark line when the third detection control unit is turned on and receives the second detection signal.

15. The display panel of claim 1, further comprising at least one third data line located in the display region, at least one third detection line partially located in the first bezel region, and at least one third detection control unit located in the bezel region; wherein a first end of the third detection line is electrically connected with the third data line through the third detection control unit, and a second end of the third detection line is configured to receive the first detection signal;

a third plurality of the plurality of display units electrically connected to the third data line are configured to emit light to display a bright line when the third detection control unit is turned on and a crack occurs in the third detection line.

16. The display panel of claim 1, wherein the first detection control unit comprises a first detection transistor, a gate electrode of the first detection transistor is electrically connected with a detection control line, a first electrode of the first detection transistor is electrically connected with the first detection line, and a second electrode of the first detection transistor is electrically connected with the first data line;

the second detection control unit comprises a second detection transistor, a gate electrode of the second detection transistor is electrically connected with the detection control line, a first electrode of the second detection transistor is electrically connected with the second detection line, and a second electrode of the second detection transistor is electrically connected with the second data line.

17. The display panel of claim 1, wherein the at least one first detection control unit and the at least one second detection control unit are located in the first bezel region.

18. A display apparatus, comprising a display panel of claim 1.

19. A method for detecting a crack, applied to the display panel of claim 1, wherein the method for detecting a crack comprises:

when performing crack detection on the display panel, turning on the first detection line and the first data line through the first detection control unit, turning on the second detection line and the second data line through the second detection control unit, and providing the first detection signal to the first detection line and the second detection line; and determining whether a crack exists in the first detection line or the second detection line based on light emitting states of the plurality of display units electrically connected to the first data line and the second data line.

* * * * *